US 6,545,349 B2

(12) United States Patent
Iwaya et al.

(10) Patent No.: US 6,545,349 B2
(45) Date of Patent: Apr. 8, 2003

(54) SEMICONDUCTOR DEVICE

(75) Inventors: Akihiko Iwaya, Tokyo (JP); Tamaki Wada, Higashimurayama (JP); Masachika Masuda, Tokorozawa (JP)

(73) Assignees: Hitachi, Ltd., Tokyo (JP); Hitach ULSI Systems Co., Ltd., Tokyo (JP)

( * ) Notice: Subject to any disclaimer, the term of this patent is extended or adjusted under 35 U.S.C. 154(b) by 113 days.

(21) Appl. No.: 09/779,609

(22) Filed: Feb. 9, 2001

(65) Prior Publication Data

US 2001/0040284 A1 Nov. 15, 2001

Related U.S. Application Data

(62) Division of application No. 09/421,274, filed on Oct. 20, 1999, now Pat. No. 6,392,295.

(30) Foreign Application Priority Data

Oct. 21, 1998 (JP) ............................................. 10-299935

(51) Int. Cl.$^7$ .............................................. H01L 23/48

(52) U.S. Cl. ........................ 257/696; 257/691; 257/690; 257/692; 257/666; 257/669; 257/735; 257/784; 257/787

(58) Field of Search ................................. 757/696, 691, 757/690, 692, 666, 669, 735, 784, 787

(56) References Cited

U.S. PATENT DOCUMENTS

| | | | | | |
|---|---|---|---|---|---|
| 6,064,112 A | * | 5/2000 | Iwaya et al. | ................. | 257/646 |
| 6,122,822 A | * | 9/2000 | Liao | ........................... | 174/52.2 |
| 6,201,297 B1 | * | 3/2001 | Masuda | ...................... | 257/690 |

FOREIGN PATENT DOCUMENTS

JP 9-116074 5/1997

* cited by examiner

*Primary Examiner*—Albert W. Paladini
*Assistant Examiner*—Luan Thai
(74) *Attorney, Agent, or Firm*—Mattingly, Stanger & Malur, P.C.

(57) ABSTRACT

A LOC type semiconductor device comprises a semiconductor chip having a main surface in which semiconductor elements and a plurality of bonding pads are formed, and a back surface opposite the main surface; a plurality of leads each having an inner part and an outer part, and including a plurality of first leads having inner end portions extended on the main surface of the semiconductor chip and a plurality of second leads having inner end portions terminating near the semiconductor chip; bonding wires electrically connecting the bonding pads to bonding portions of the inner parts of the first and the second leads; and a sealing member sealing the semiconductor chip therein. A first bending portion is formed in the inner part of each second lead to prevent the sealing member from transformation by forming the sealing member in satisfactory resin balance between an upper portion and a lower portion of the sealing member.

4 Claims, 16 Drawing Sheets

SEMICONDUCTOR DEVICE

This is a divisional application of U.S. Ser. No. 09/421,274, filed Oct. 20, 1999, now U.S. Pat. No. 6,392,295.

FIELD OF THE INVENTION

The present invention relates to techniques for manufacturing a semiconductor device and, more particularly, to techniques effective in application to the prevent on or transformation (e.g. camber) of a sealing member of a LOC (lead-on-chip) which having a semiconductor chip provided with inner portion of leads arranged on a main surface thereof.

BACKGROUND OF THE INVENTION

The inventors of the present invention examined the following techniques during studies for making the present invention.

In a semiconductor device on which an LSI (large-scale integration) chip is mounted, a semiconductor device called LOC is known as a semiconductor device in which a package size is reduced.

In the LOC, end portions of inner parts of leads are arranged on a main surface, i.e., a surface provided with a circuit, of a semiconductor chip, and bonding portions of the end portions of the inner parts are electrically connected to the corresponding bonding pads of the semiconductor chip by means of wire for bonding.

The semiconductor chip is bonded to end portions of the inner parts of the leads with an insulating tape or the like and is supported by end portions of the inner parts of the leads.

The semiconductor chip, the inner parts of the leads and the bonding wires are sealed in a sealing resin to form a sealing member (i.e. package).

In recent years, efforts have been made for chip shrinking for cost reduction and a LOC having a region of a relatively large area around the semiconductor chip is occurred. In the LOC, because the size of the semiconductor chip is small, only leads (first leads) are arranged on the main surface of the semiconductor chip, and leads (second leads) have inner parts terminating near the semiconductor chip.

In the LOC having the second leads not arranged on the main surface of the semiconductor chip, the inner parts of the second leads affect adversely resin balance, i.e., a state of distribution of a resin in regions on the opposite sides of the inner parts, when sealing the semiconductor chip in a sealing member by molding and, sometimes, the sealing member transforms.

When the semiconductor chip is shrunk, a portion of the sealing member extending in regions around the semiconductor chip becomes large and regions in which resin balance is unsatisfactory increase.

A LOC intended to ensure the uniform flow of a resin when forming a seating member to prevent the sealing member from transformation is mentioned in Japanese Patent Lad-Open No. 9-110074. This LOC is provided with a branch lead branched from a lead and provided with resin balancing parts.

SUMMARY OF THE INVENTION

In the LOC disclosed in Japanese Patent Laid-Open No. 9-116074, the resin balancing parts are formed only on the branch leads branching from the leads, and are formed only in middle portions of the area outside the chip along the long sides of the semiconductor chip.

Accordingly, portions of the sealing member corresponding to regions around the semiconductor chip, i.e., portions of the sealing member corresponding to regions along and outside the long sides and the short sides of the semiconductor chip, increases with the progress of chip shrinking. Consequently, the transformation of the sealing member cannot be prevented when the resin balancing parts are disposed only in the regions outside of the long sides of the semiconductor chip.

Long bonding wires are necessary to connect the leads not disposed on the main surface of the semiconductor chip to the corresponding bonding pads by wire bonding. Such long wires are subject to wire flow during molding, and the flowed bonding wires deteriorates the performance and reliability of the semiconductor device.

The leads (second leads) not overlying the main surface of the semiconductor chip extend on a level (a level left from the semiconductor chip) higher than that on which the leads (first Leads) arranged on the main surface of the chip extend, therefore, portions of the sealing member overlying the second leads are thin and it is possible that the bonding wires are exposed from the sealing member, and the second leads and the bonding wires can be seen through the sealing member.

Accordingly, it is an object of the present invention to provide a semiconductor device, in a LOC semiconductor device having leads not overlying the semiconductor chip, to prevent transformation of a sealing member, and having improved ability and reliability, and to provide a process for manufacturing such a semiconductor device.

According to a first aspect of the present invention, a semiconductor device comprises: a semiconductor chip having a main surface in which semiconductor elements and a plurality of bonding pads are formed, and a back surface opposite the main surface; a plurality of leads each having an inner part and an outer part, and including a plurality of first leads having inner portions placed on the main surface of the semiconductor chip and a plurality of second leads having inner end portions terminating near the semiconductor chip; bonding wires electrically connecting the bonding pads to the inner parts of the first and the second leads; and a sealing member sealing the semiconductor chip, the inner parts of the leads and the bonding wires therein; wherein each of the inner parts of the second leads sealed in the sealing member has a bending portions of the inner part and falling substantially in a direction from the main surface toward the back surface of the semiconductor chip.

When forming the sealing member of the semiconductor device by molding, resin balance between portions of the sealing member on the upper and the lower side of the second leads is satisfactory, so that the transformation of the sealing member of the LOC having the shrunk semiconductor chip can be prevented.

According to a second aspect of the present invention, a semiconductor device comprises: a semiconductor chip having a main surface in which semiconductor elements and a plurality of bonding pads are formed; a plurality of leads each having an inner part and an outer part, and including a plurality of first leads having inner portions placed on the main surface of the semiconductor chip and a plurality of second leads having inner end portions terminating near the semiconductor chip; bonding wires electrically connecting the bonding pads to the inner parts of the first and the second leads; and a sealing member sealing the semiconductor chip, the inner parts of the leads and the bonding wires therein; wherein each of the inner parts of the second leads sealed in the sealing member has a high portion extending on a level above the main surface of the semiconductor chip and a low portion extending on a level below the main surface of the semiconductor chip, and the total area of the low portions of the inner parts of the second leads is greater than that of the high portions of the same.

According to a third aspect of the present invention, a semiconductor device comprises: a semiconductor chip having a main surface in which semiconductor elements and a plurality of bonding pads are formed, and a back surface opposite the main surface; a plurality of leads each having an inner part and an outer part, and including a plurality of first leads having inner end portions placed on the main surface of the semiconductor chip and a plurality of second leads having connecting parts terminating near the semiconductor chip; bonding wires electrically connecting the bonding pads to the inner parts of the first and the second leads; and a sealing member sealing the semiconductor chip, the inner parts of the leads and the bonding wires therein; wherein some of the first leads and the second leads have first bending portions of the inner parts and falling substantially in a direction from the main surface toward the back surface of the semiconductor chip, and each of the same first leads respectively having the first bending portions has a second bending portion rising substantially in a direction from the back surface toward the main surface of the semiconductor chip and formed at a position nearer to the semiconductor chip than the first bending portion.

A semiconductor device manufacturing process according to the present invention comprises the steps of: preparing a lead frame having a frame member, and a plurality or leads including a plurality of first leads respectively having inner parts arranged so as to overlie a main surface of a semiconductor chip, and a plurality of second leads respectively having inner parts terminating near the semiconductor chip and having bending portions thereof and bending substantially in a direction from the main surface toward a back surface of the semiconductor chip; bonding the inner parts of the first leads to the main surface of the semiconductor chip; electrically connecting bonding pads of the semiconductor chip to the corresponding inner parts of the leads by bonding wires; forming a sealing member to seal the semiconductor chip, the inner parts of the leads and the bonding wires therein by substantially evenly distributing a resin in regions of a cavity of a mold on the upper and the lower side of the bending portions of the leads; and cutting off outer parts of the leads projecting from the sealing member from the frame member of the lead frame.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
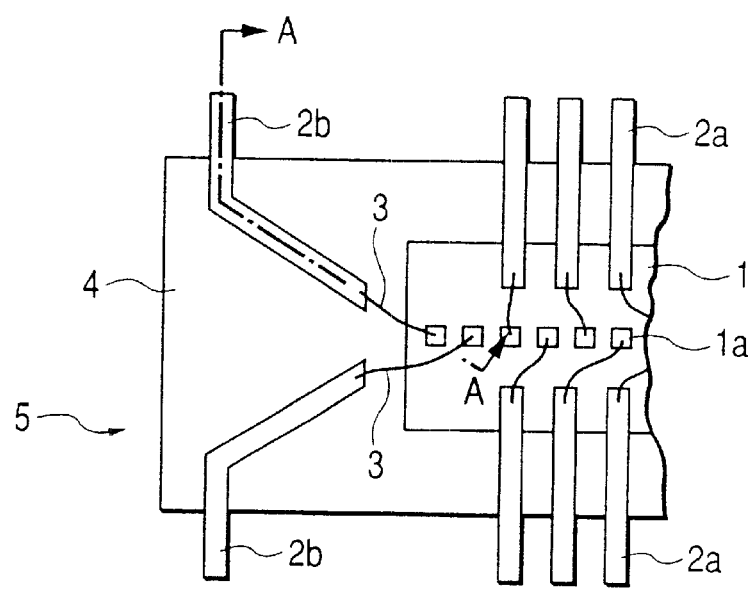
FIG. 1 is a fragmentary plan view of a semiconductor device in a first embodiment according to the present invention, in which a sealing member is removed.

Preferred embodiments of the present invention will be described hereinafter with reference to the accompanying drawings, in which parts having the same functions are designated by the same reference characters and the repetitive description thereof will be omitted to avoid duplication.

First Embodiment

Figure 2:
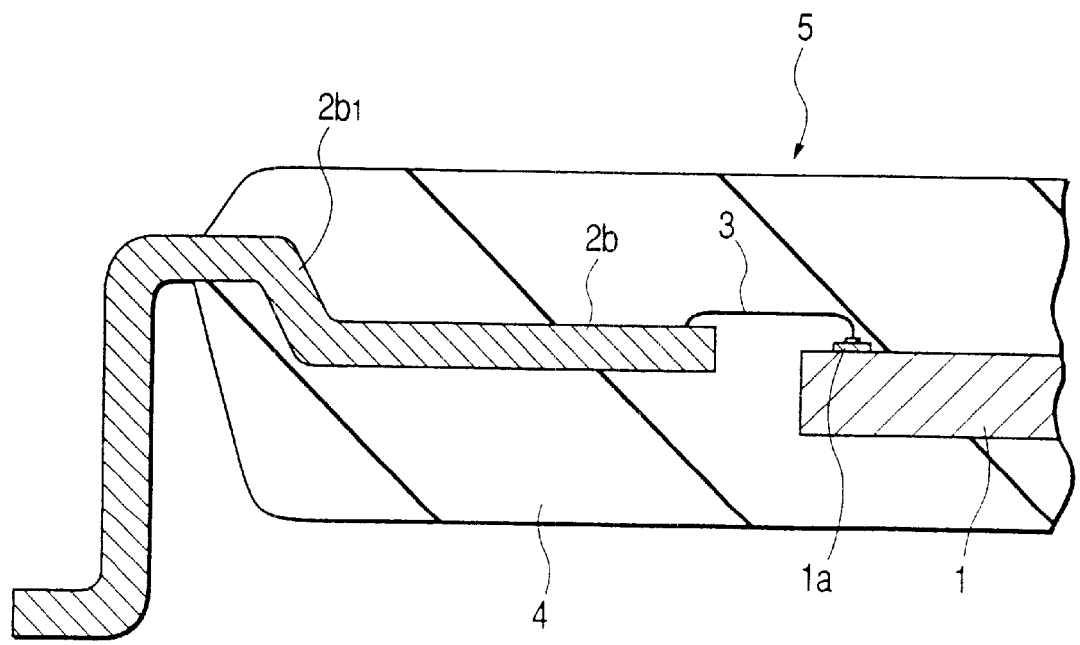
FIG. 2 is an enlarged, fragmentary sectional view taken on line A—A in FIG. 1.
Figure 3:
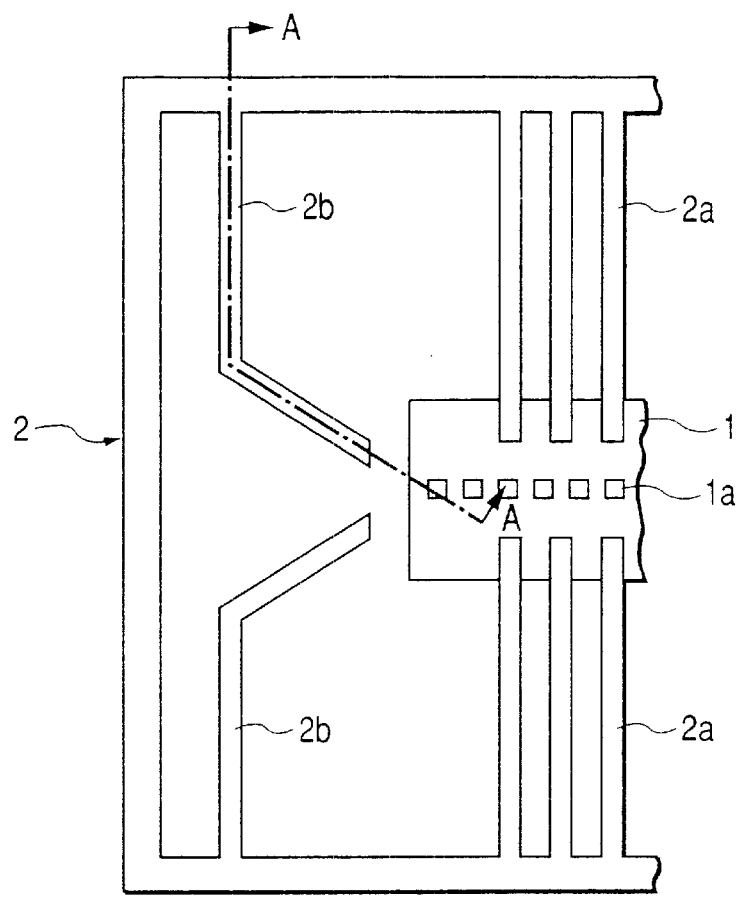
FIG. 3 is an enlarged, fragmentary plan view of a lead frame and a semiconductor chip in a state after the completion of a die bonding process in a process for manufacturing the semiconductor device in the first embodiment.
Figure 4:
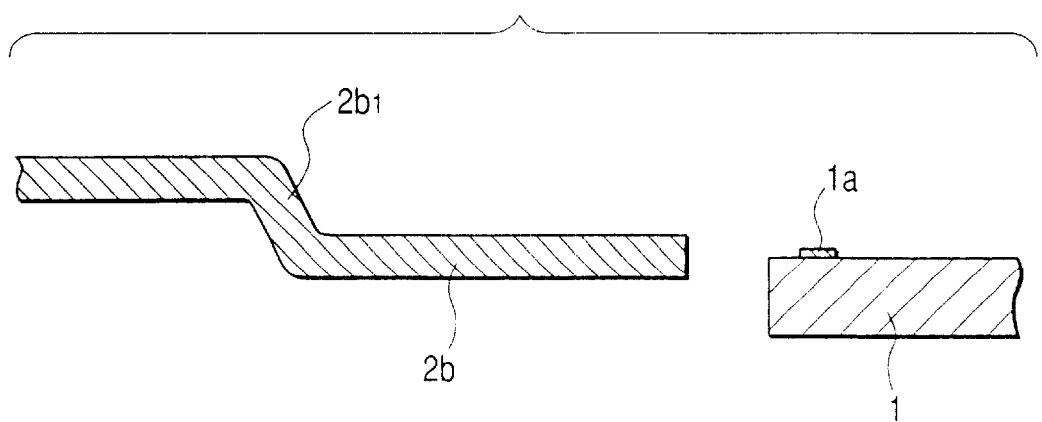
FIG. 4 is an enlarged, fragmentary sectional view taken on line A—A in FIG. 3.
Figure 5:
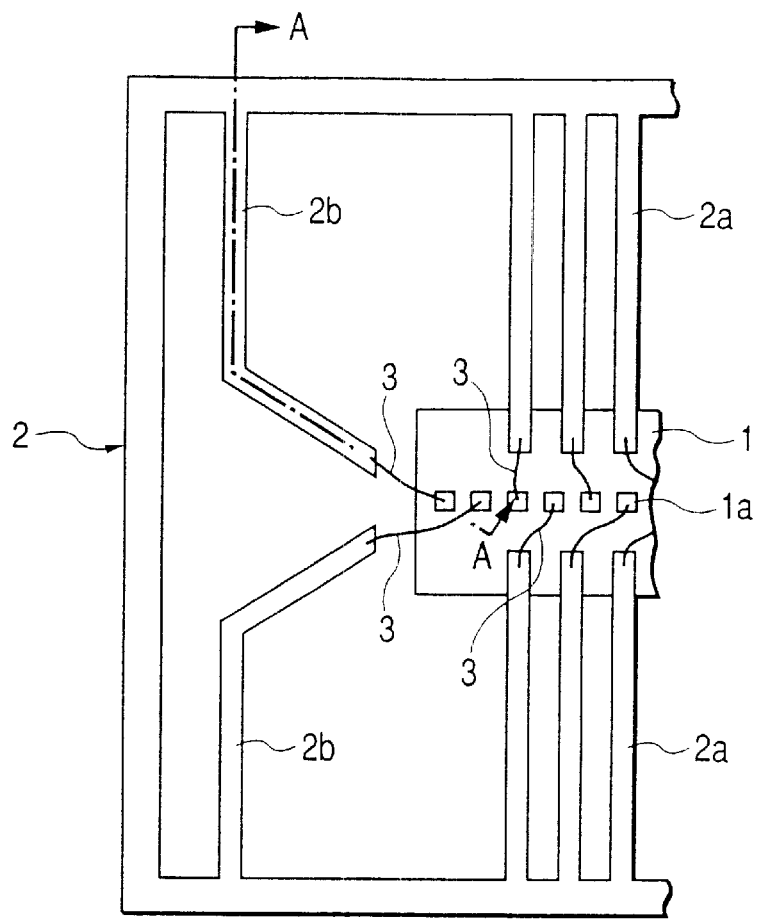
FIG. 5 is an enlarged, fragmentary plan view of the semiconductor device in the first embodiment in a state after the completion of a wire bonding process in the process for manufacturing the semiconductor device in the first embodiment.
Figure 6:
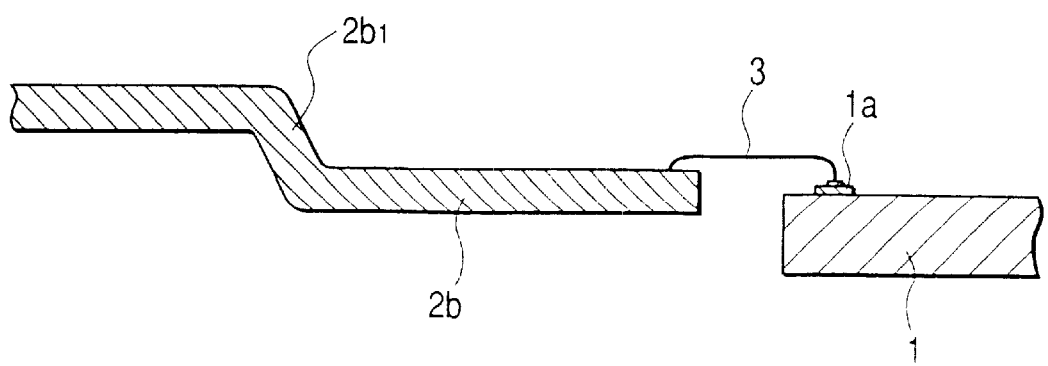
FIG. 6 is an enlarged, fragmentary sectional view taken on line A—A in FIG. 5.
Figure 7:
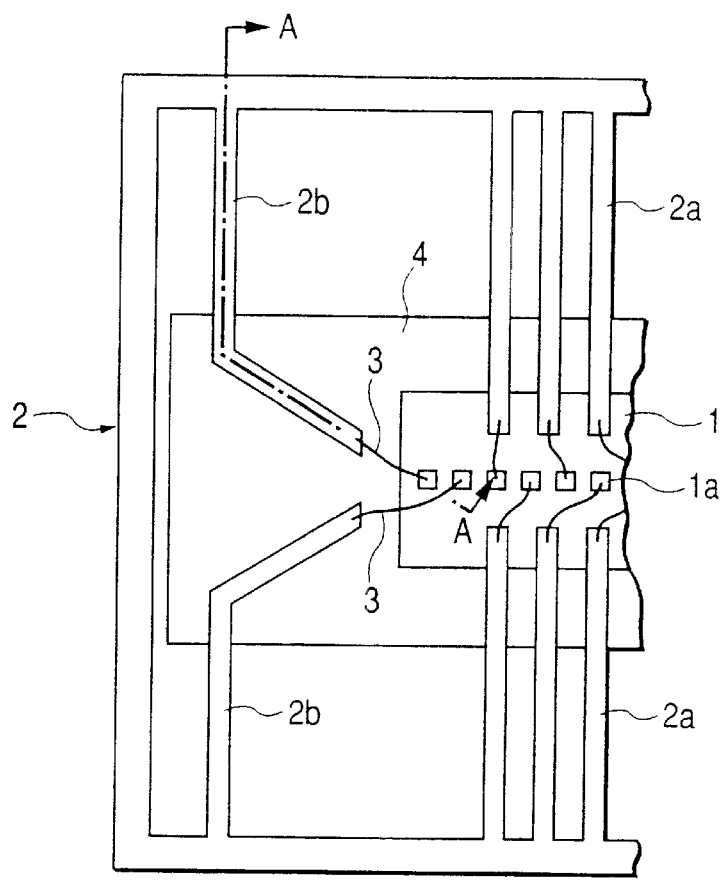
FIG. 7 is an enlarged, fragmentary plan view of the semiconductor device in a state after the completion of a resin molding process in the process for manufacturing the semiconductor device in the first embodiment, in which the sealing member is removed.
Figure 8:
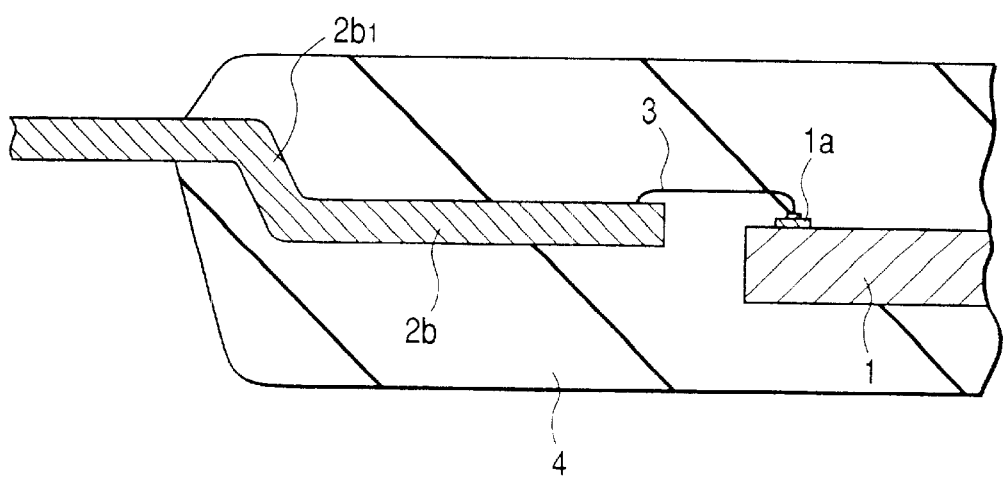
FIG. 8 is an enlarged fragmentary sectional view taken on line A—A in FIG. 7.

FIG. 1 is a fragmentary plan view of a semiconductor device in a first embodiment according to the present invention, in which a sealing member is removed, FIG. 2 is an enlarged, fragmentary sectional view taken on line A—A in FIG. 1, FIG. 3 is an enlarged, fragmentary plan view of a lead frame and a semiconductor chip in a state after the completion of a die bonding process in a process for manufacturing the semiconductor device in the first embodiment, FIG. 4 is an enlarged, fragmentary sectional view taken on line A—A in FIG. 3, FIG. 5 is an enlarged, fragmentary plan view in a state after the completion of a wire bonding process in the process for manufacturing the semiconductor device in the first embodiment, FIG. 6 is an enlarged, fragmentary sectional view taken on line A—A in FIG. 5, FIG. 7 is an enlarged, fragmentary plan view in a state after the completion of a packaging process in the process for manufacturing the semiconductor device in the first embodiment, in which the sealing member is removed, and FIG. 8 is an enlarged fragmentary sectional view taken on line A—A in FIG. 7.

Referring to FIGS. 1 and 2, a semiconductor device in a first embodiment according to the present invention is a semiconductor device of a LOC (Lead On Chip) structure and provided with a semiconductor chip 1 having a small size achieved by chip shrinking. In this embodiment, the semiconductor chip 1 is a DRAM (dynamic random-access memory) provided with semiconductor elements. The semiconductor chip 1 is provided on its main surface with fifty-four (a plurality of) bonding pads (external electrodes) 1a. The semiconductor chip 1 may be a memory or a logic semiconductor chip provided with a logic circuit such as a SRAM (static random-access memory). The semiconductor chip 1 has a plurality of external electrodes such as a bonding pad 1a. First leads 2a of a lead frame 2 are bonded to the main surface of the semiconductor chip 1 with an adhesive. The number of the first leads 2a is, for example, fifty. The twenty-five first leads 2a are arranged along one of the longitudinal sides of the semiconductor chip 1 and the other twenty-five first leads 2a are arranged along the other longitudinal side of the semiconductor chip 1. The bonding pads 1a, i.e., external electrodes, of the semiconductor chip 1 are connected electrically to the first leads 2a by bonding wires 3 of gold or aluminum.

Inner parts of second leads 2b of the lead frame 2 arranged around the semiconductor chip 1 have bending portions 2b1, respectively, which are the feature of the semiconductor device in the first embodiment. The number of the second Leads 2b having the bending portions 2b1 is arranged, for example, four at the outside of the semiconductor chip 1. The bending portions 2b1 formed in the second leads 2b are sealed in a sealing member 4 (i.e. package). The sealing member 4 is formed of a sealing resin 8 (FIG. 18), i.e., an insulating material.

The bonding pads 1a as external electrodes of the semiconductor chip 1 are connected electrically to the second leads 2b by bonding wires 3 of gold or aluminum. In the second lead 2b of a first embodiment, an area that each bonding wire 3 electrically connecting the bonding pad 1a to the second lead 2b is arranged at a lower level than the surface of the bending portion 2b1 where the upper surface of the second lead 2b, because the bending portion 2b1 is formed.

The first leads 2a are fixed to the main surface of the semiconductor chip sealed in the sealing member 4. The inner parts of some of the second leads 2b arranged around the semiconductor chip 1 are provided with the bending portions 2b1, respectively, and each bonding wire 3 electrically connecting the bonding pad 1a to the second lead 2b is connected to an inner portion of an inner part of each second lead 2b extending from the lower end of the bending portion 2b1 on a level lower than that on which an outer portion of the same extends from the upper end of the bending portion 2b1. Consequently, the thickness of portions of the sealing member 4 overlying the parts of the second leads 2b connected to the bonding wires 3 can be increased. Therefore, portions of the sealing member 4 overlying the parts of the second leads 2b connected to the bonding wires 3 can be formed in a thickness approximately equal to that of portions of the sealing member 4 underlying the parts of the second leads 2b connected to the bonding wires 3. Thus, the transformation of the sealing member 4 can be reduced and the performance and reliability of the semiconductor device are enhanced.

Since the thickness of portions of the sealing member 4 overlying the parts of the second leads 2b connected to the bonding wires 3 car be increased, the second leads 2b cannot be seen through the sealing member 4 even if the second leads 2b are deformed.

Since the inner parts of the plurality of second leads 2b arranged around the semiconductor chip 1 are provided with the bending portions 2b1, respectively, and the inner portions of the inner parts of the second leads 2b connected to the bonding wires 3 extend on a level lower than that on which the outer portions of the inner parts of the second leads 2b extend from the upper ends of the bending portions 2b1 extend, respectively, the inner portions of the inner parts of the second leads 2b connected to the bonding wires 3 can be disposed close to the corresponding bonding pads 1a of the semiconductor chip. Consequently, the deformation of the bonding wires 3 due to wire flow during molding can be suppressed and the performance and reliability of the semiconductor device are enhanced.

A process for manufacturing the semiconductor device in the first embodiment will be described hereinafter.

The first leads 2a of the lead frame 2 are positioned over the main surface of the semiconductor chip 1, and bonded with an adhesive to the main surface of the semiconductor chip 1 as shown in FIGS. 3 and 4. The lead frame 2 of the first embodiment has the bending portions 2b1 formed in the inner parts sealed in the sealing member 4 of the second leads 2b except for the first leads 2a which are fixed on the main surface of the semiconductor chip 1. The lead frame 2 is featured also by the second leads 2b having the inner parts arranged around the semiconductor chip 1, and provided with the bending portions 2b1 and the inner portions of the inner parts thereof connected to the bonding wires 3 and extending on a level lower than that on which the outer portions of the inner parts of the second leads 2b extend from the upper ends of the bending portions 2b1 extend, respectively.

Subsequently, the bonding pads (external electrodes) 1a of the semiconductor chip 1 are connected electrically to the first leads 2a and the second leads 2b by the gold or aluminum bonding wires 3, respectively, as shown in FIGS. 5 and 6 by a wire bonding machine.

The semiconductor chip 1, the inner parts of the first leads 1a, the inner parts of the second leads 2b and the bonding wires 3 are sealed in the sealing member 4 formed by molding a sealing resin 8 (FIG. 18) by a molding machine as shown in FIGS. 7 and 8. A sealing member 4 can be formed of an insulating material other than the resin may be used instead of the sealing member 4 made of a molding resin.

The outer parts of the first leads 2a and the second leads 2b projecting outside from the sealing member 4 are bent by a lead shaping machine. Then, the bars and frame bars of the lead frame 2 are cut off to complete the semiconductor device as shown in FIGS. 1 and 2.

The process for manufacturing the semiconductor device of the first embodiment is featured by the lead frame 2 having the second leads 2b having the inner portions connected to the bonding wires 3 and extending from the lower ends of the bending portions 2b1 on the level lower than that on which the outer portions extend.

In the wire bonding process of the process or manufacturing the semiconductor device, the second leads 2b can electrically be connected to the corresponding bonding pads 1a of the semiconductor chip 1 by relatively short bonding wires 3 because the inner portions of the inner parts of the second leads 2b connected to the bonding wires 3 can be disposed close to the corresponding bonding pads 1a of the semiconductor chip 1. Consequently, the deformation of the bonding wires 3 due to wire flow during molding can be suppressed, the performance and reliability of the semiconductor device are enhanced, and the semiconductor device can be fabricated at a high yield rate.

In the process for forming the sealing member of the first embodiment, since the thickness of portions of the sealing member 4 overlying the parts of the second leads 2b connected to the bonding wires 3 can be increased, portions of the sealing member 4 overlying the parts of the second leads 2b connected to the bonding wires 3 can be formed in a thickness approximately equal to that of portions of the sealing member 4 underlying the parts of the second leads 2b connected to the bonding wires 3. Thus, the portions of the sealing member 4 overlying the second leads 2b and the portions of the same underlying the second leads 2b can be formed in satisfactory resin balance, and the transformation (camber) of the sealing member 4 can be reduced. Consequently, the performance and reliability of the semiconductor device are enhanced and the semiconductor device can be fabricated at a high yield rate.

Since the thickness of portions of the sealing member 4 overlying the parts of the second leads 2b connected to the bonding wires 3 can be increased, the same portions of the sealing member 4 are formed in a relatively great thickness and hence the second leads 2b cannot be seen through the sealing member 4 even if the second leads 2b are deformed.

Second Embodiment

Figure 9:
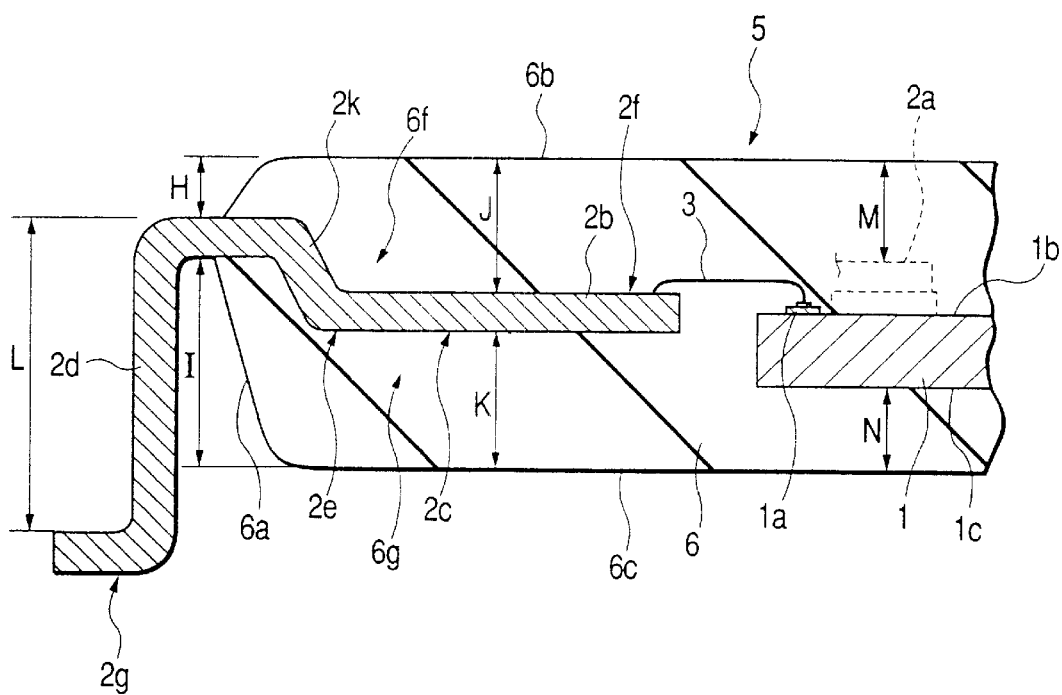
FIG. 9 is an enlarged, fragmentary sectional view of a semiconductor device in a second embodiment according to the present invention.
Figure 10A:
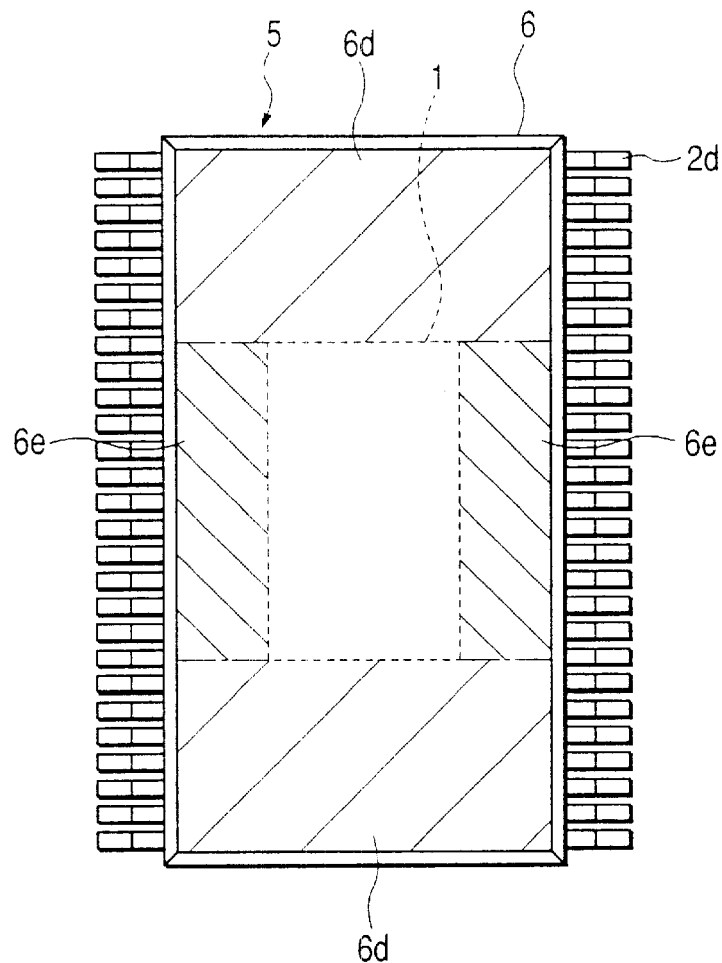
FIGS. 10(a) and 10(b) are a plan view each of the region of the sealing member and a sectional view, respectively, of the semiconductor device in a second embodiment according to the present invention.
Figure 10B:
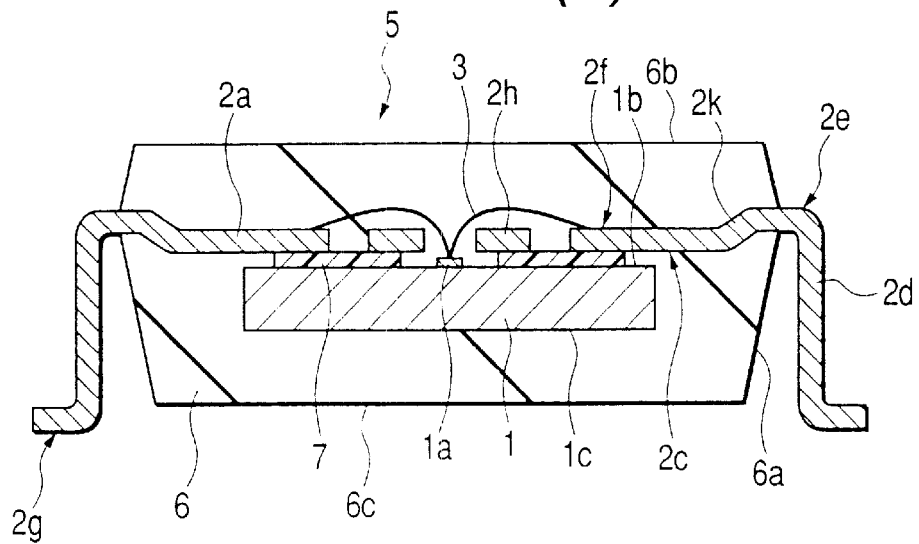
Figure 11:
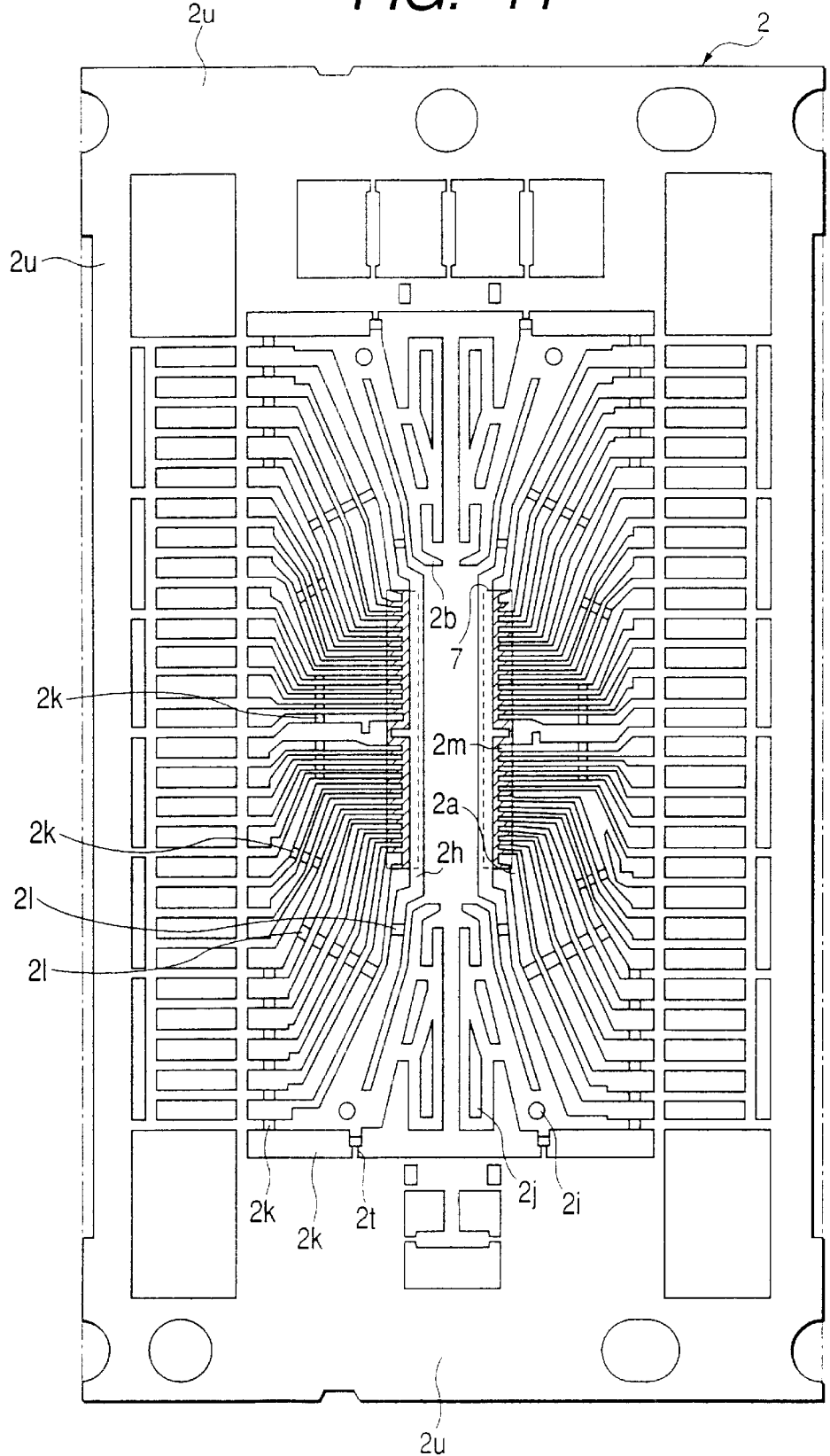
FIG. 11 is an enlarged plan view of a lead frame employed by a process for manufacturing the semiconductor device in the second embodiment.
Figure 12:
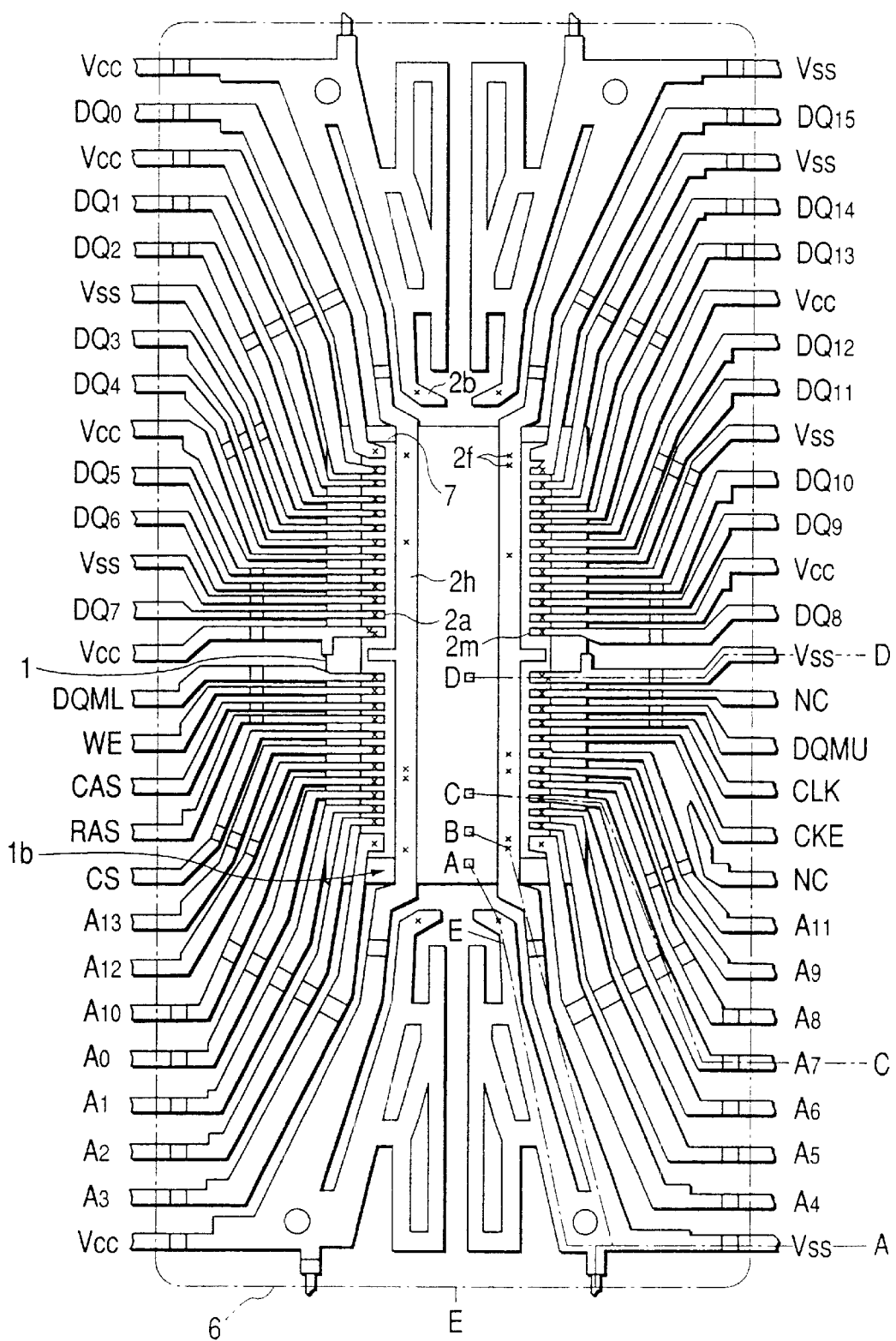
FIG. 12 is an enlarged plan view of the lead frame and a semiconductor chip mounted on the lead frame in a state after the completion of a die bonding process included in the process for manufacturing the semiconductor device in the second embodiment.
Figure 13:
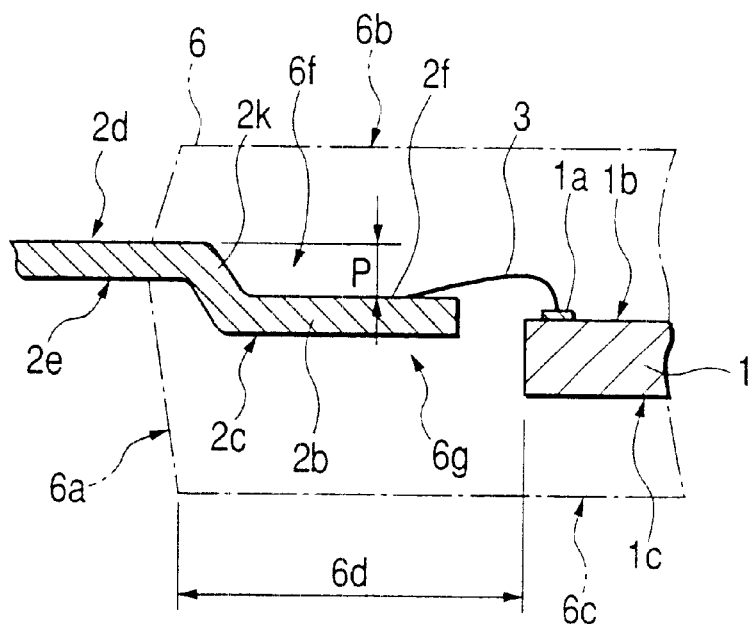
FIG. 13 is an enlarged, fragmentary sectional view taken on line A—A in FIG. 12.
Figure 14:
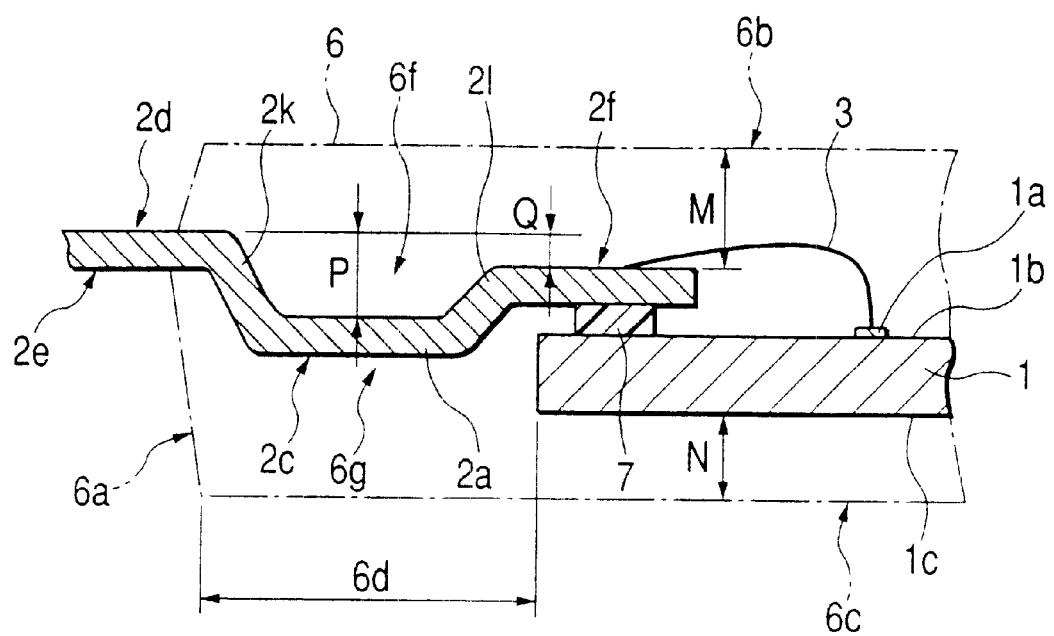
FIG. 14 is an enlarged, fragmentary sectional view taken on line A-B FIG. 12.
Figure 15:
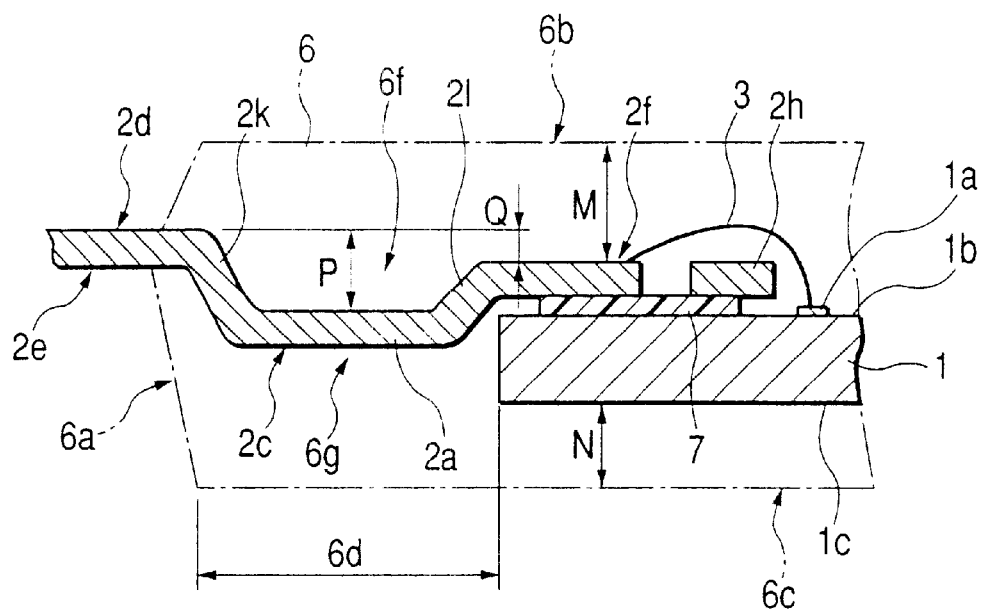
FIG. 15 is an enlarged, fragmentary sectional view taken on line C—C in FIG. 12.
Figure 16:
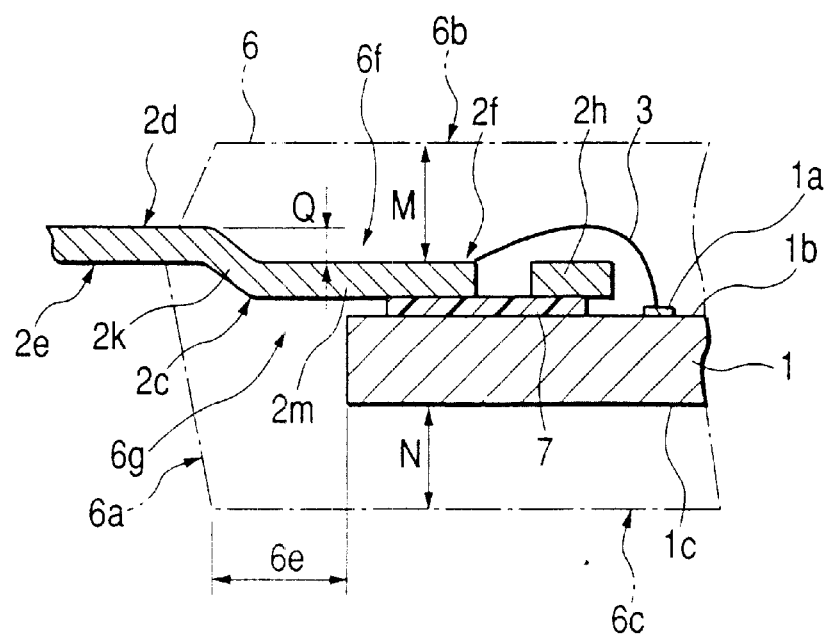
FIG. 16 is an enlarged, fragmentary sectional view taken on line D—D in FIG. 12.
Figure 17:
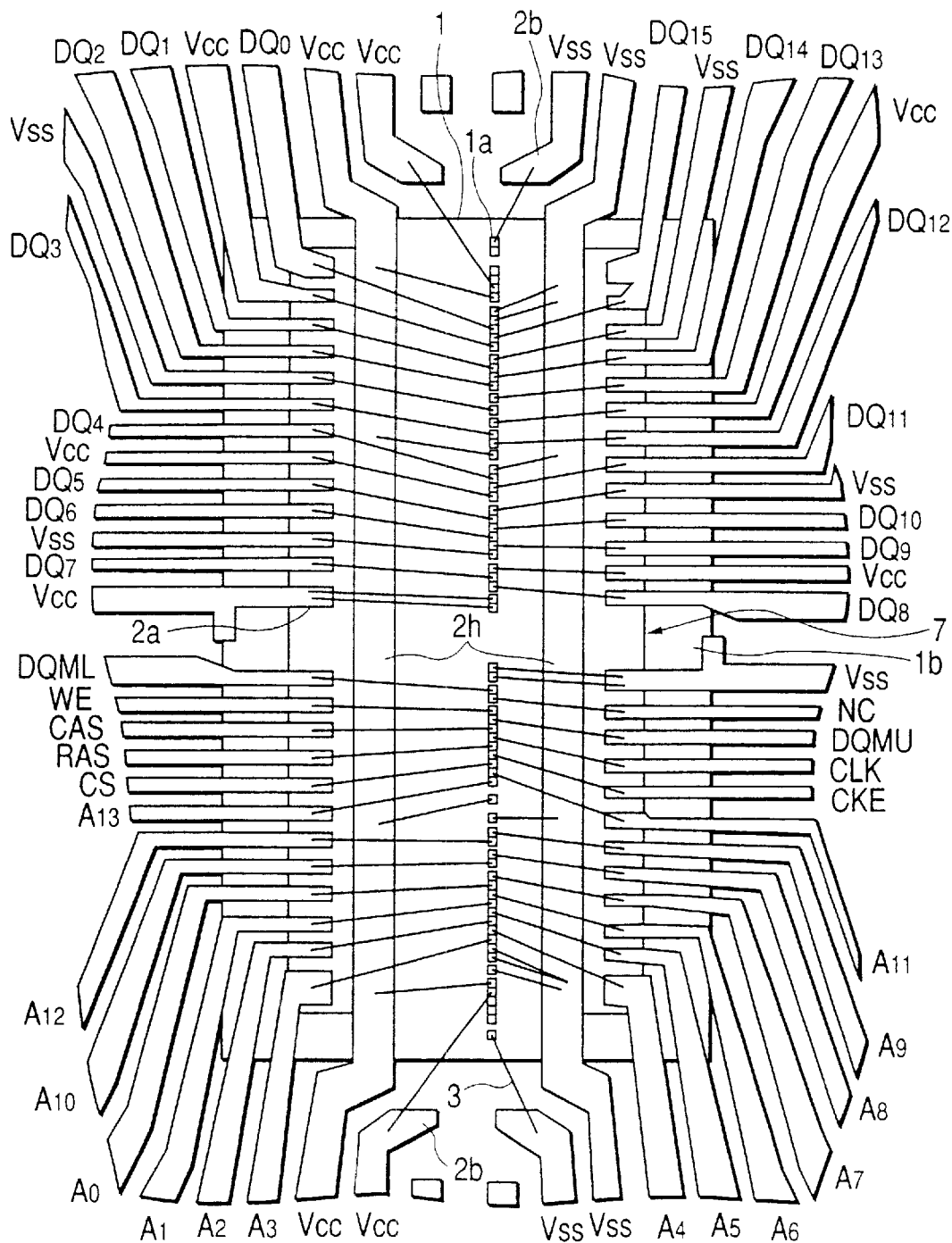
FIG. 17 is an enlarged, fragmentary plan view of a lead frame and a semiconductor chip mounted on the lead frame in a state after the completion of a wire bonding process in the process for manufacturing the semiconductor device in the second embodiment.
Figure 18:
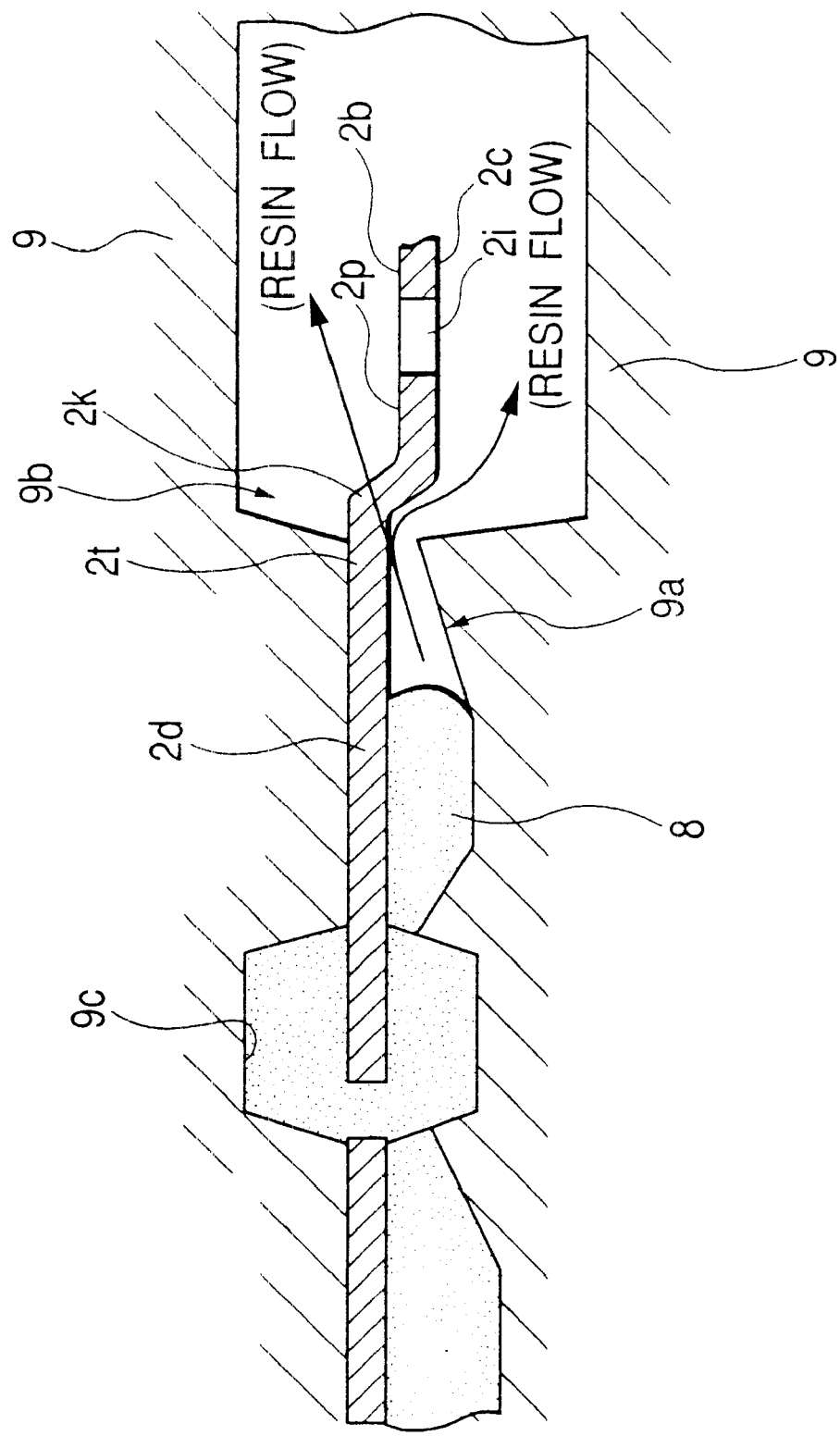
FIG. 18 is an enlarged, fragmentary sectional view taken on line E—E in FIG. 12 of assistance in explaining a sealing resin injecting method by which a sealing resin is injected into a mold by the process for manufacturing the semiconductor device in the second embodiment.
Figure 19:
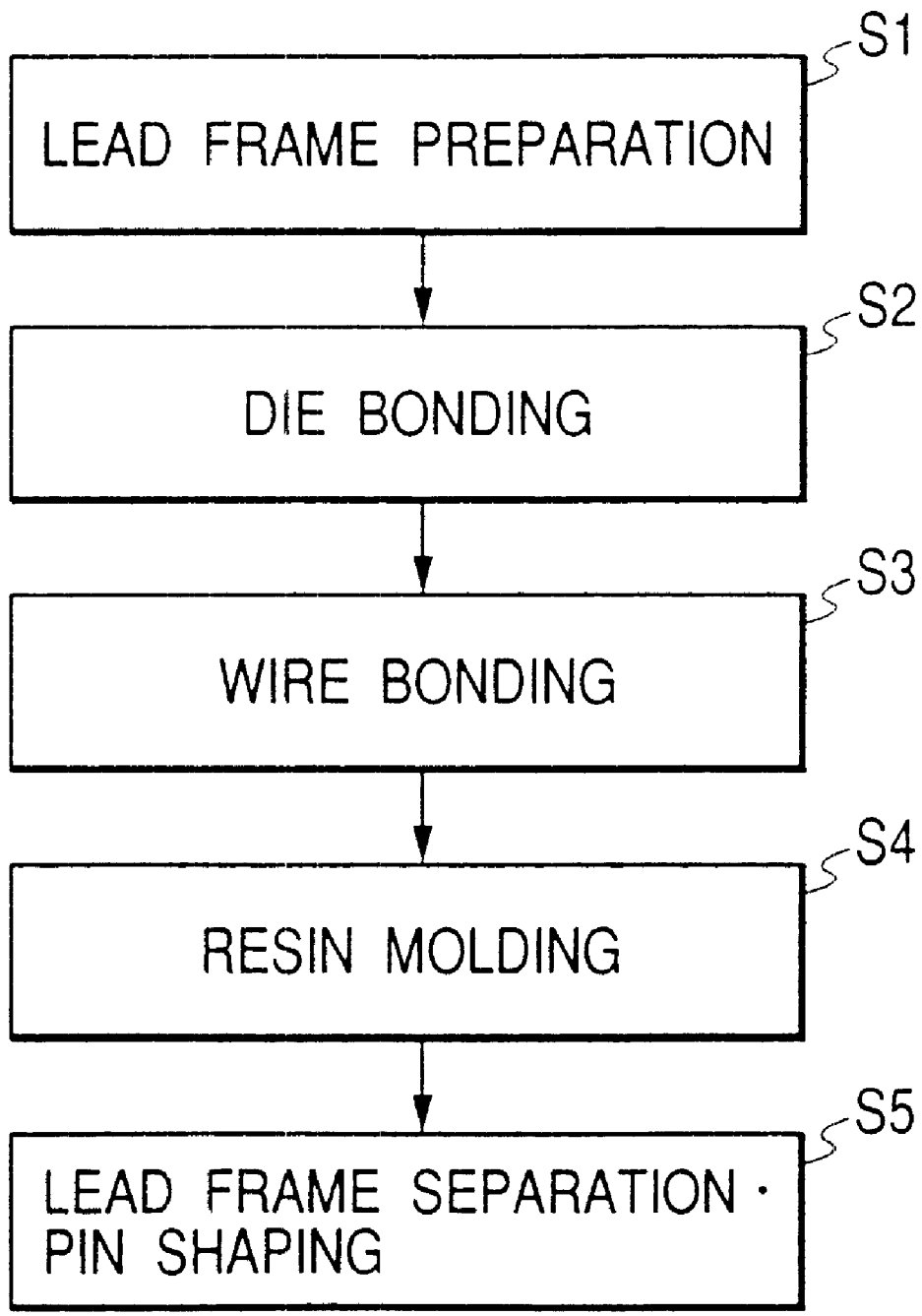
FIG. 19 is a flow chart of an assembling procedure for assembling the semiconductor device in the second embodiment.
Figure 20:
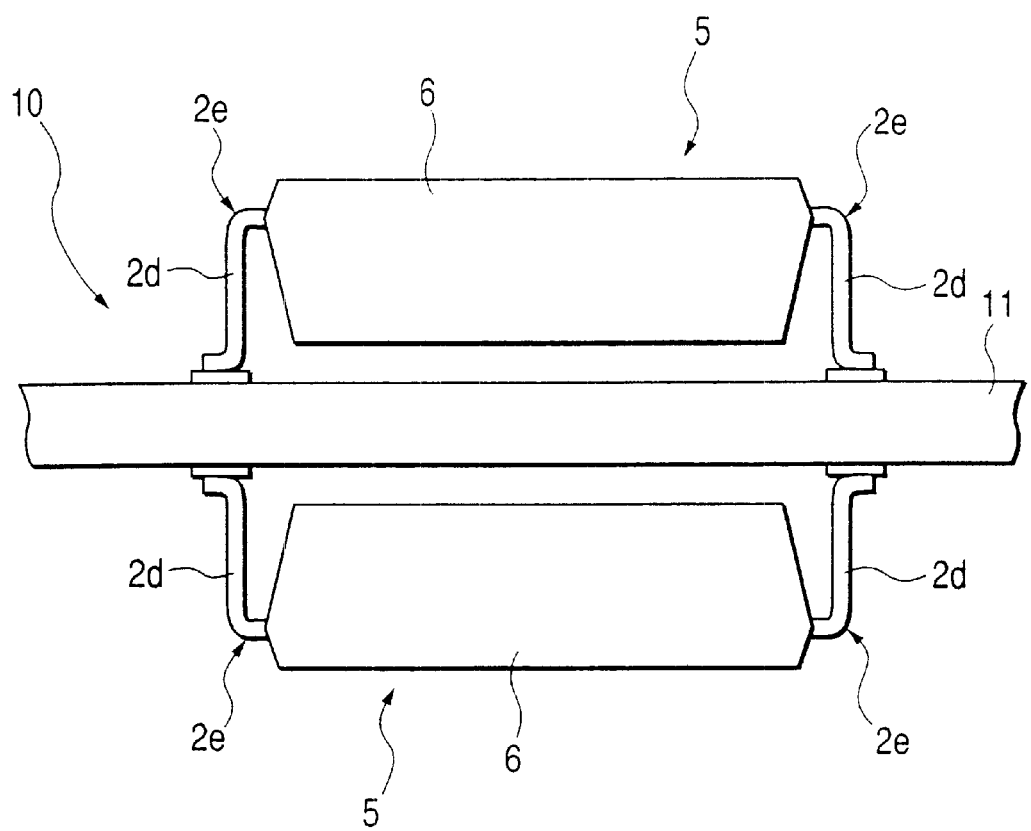
FIG. 20 is a front elevation of semiconductor device in the second embodiment as mounted on a mounting board.

FIG. 9 is an enlarged, fragmentary sectional view of a semiconductor device in a second embodiment according to the present invention, FIGS. 10(a) and 10(b) are a plan view and a sectional view, respectively, of the semiconductor device, FIG. 11 is an enlarged plan view of a lead frame employed by a process for manufacturing the semiconductor device in the second embodiment, FIG. 12 is an enlarged plan view of the lead frame and a semiconductor chip mounted on the lead frame in a state after the completion of a die bonding process included in the process or manufacturing the semiconductor device in the second embodiment, FIG. 13 is an enlarged, fragmentary sectional view taken on line A—A in FIG. 12, FIG. 14 is an enlarged, fragmentary sectional view taken on line A–B in FIG. 12, FIG. 15 is an enlarged, fragmentary sectional view taken on line C—C in FIG. 12, FIG. 16 is an enlarged, fragmentary sectional view taken on line D—D in FIG. 12, FIG. 17 is an enlarged, fragmentary plan view of a lead frame and a semiconductor chip mounted on the lead frame in a state after the completion of a wire bonding process in the process for manufacturing the semiconductor device in the second embodiment, FIG. 18 is an enlarged, fragmentary sectional view taken on line E—E in FIG. 12 of assistance in explaining a sealing resin injecting method by which a sealing resin is injected into a mold by the process for manufacturing the semiconductor device in the second embodiment, FIG. 19 is a flow chart of an assembling procedure for assembling the semiconductor device in the second embodiment, and FIG. 20 is a front elevation of semiconductor device in the second embodiment as mounted on a mounting board.

A semiconductor device in the second embodiment, similarly to the semiconductor device in the first embodiment, is of LOC construction provided with a semiconductor chip 1 formed in a small size achieved by chip shrinking. A lead frame 2 has first leads 2a having inner end parts placed on and bonded to a main surface 1b of the semiconductor chip 1, and second leads 2b having inner parts terminated and arranged around the semiconductor chip 1.

The basic construction of an LOC type semiconductor device 5 in the second embodiment will be described with reference to FIG. 9. FIG. 9 is an enlarged fragmentary sectional view corresponding to a section along line A—A in FIG. 12. The LOC 5 comprises a semiconductor chip 1 having a main surface 1b in which semiconductor elements and a plurality of bonding pads 1a are formed and a back surface 1c opposite to the main surface 1b, a lead frame having a plurality of leads 2e including a plurality of first leads 2a each having an inner part 2c overlying the main surface 1b of the semiconductor chip 1, and an outer part 2d, and a plurality of second leads 2b each having an inner part 2c having a bonding portion 2f terminating near the semiconductor chip 1 and connected to a bonding wire 3, and an outer part 2d, bonding wires 3 electrically connecting the bonding portions 2f of the inner parts 2c of the first leads 2a and the second leads 2b to the bonding pads 1a, respectively, and a sealing member 6 sealing therein the semiconductor chip 1, the inner parts 2c of the leads 2e and the bonding wires 3. The inner parts 2c of the second leads 2b sealed in the sealing member 6 have bending portions of the inner parts 2c and falling substantially in a direction from the main surface 1b toward the back surface 1c of the semiconductor chip 1.

Generally, in the LOC, the plurality of second leads 2b are bonded to the main surface 1b of the semiconductor chip 1. Therefore, the leads 2e including first leads 2a and the second leads 2b project outside from positions nearer to the upper surface 6b of the sealing member 6 on a side surface 6a of the sealing member 6, and the outer parts 2d extending outside the sealing member 6 are bent down at portions thereof near the side surface 6a of the sealing member 6. As shown in FIG. 9, the distance H between the upper surface of a portion of the lead 2e protecting from the side surface 6a of the sealing member 6 and the upper surface 6b of the sealing member 6 is far shorter than the distance I between the lower surface of the same portion of the lead 2e protecting from the side surface 6a of the sealing member 6 and the lower surface 6c of the sealing member 6 (H<<I). Therefore, the outer part 2d of each lead 2e bent so as to extend downward can be formed in a very long length L. When the LOC 5 is mounted on a mounting board 11 (FIG. 20) by attaching the outer parts 2d of the leads 2e to a circuit formed on the mounting board 11 with solder for cycle tests to test the reliability of the LOC 5, the outer parts 2d having the long length L reduces stress that is induced in the solder. Consequently, the life of the solder bonding the outer parts 2c to the circuit of the mounting board can be extended.

Since the inner parts 2c of the second leads 2b sealed in the sealing member 6 have bending portions 2k formed by bending portions of the inner parts 2c and falling substantially in a direction from the main surface 1b toward the back surface 1c of the semiconductor chip 1, the inner parts 2c can be disposed in a middle region of the sealing member 6 with respect to the thickness of the sealing member 6. Therefore, the sealing member 6 can be formed so that the thickness J of an upper portion 6f of the sealing member 6 overlying the inner parts 2c and the thickness K of a lower portion 6g of the same underlying the inner parts 2c are approximately equal to each other (J≈K).

Thus, in the LOC 5 in the second embodiment of LOC construction provided with the semiconductor chip 1 formed in a small size achieved by chip shrinking, the upper portion 6f (upper resin part) and the lower portion 6g (lower resin part) of the sealing member 6 respectively on the opposite sides of a plane including the bonding portions 2f of the inner part 2c of the second leads 2b can be formed in satisfactory resin balance and hence the transforming of the sealing member can be prevented.

In this description, the words 'up', 'upper', 'upward' 'high' and the like are used to modify directions, positions, parts and the like farther from the contact surfaces 2g of the outer parts 2d of the leads 2e to be brought into contact with the mounting board 11, and the words 'down', 'lower', 'downward', 'low' and the like are used to modify directions, positions, parts and the like nearer to the contact surfaces 2g of the outer parts 2d of the leads 2e.

The construction of the LOC 5 will be described in detail with reference to FIGS. 10 to 17. FIGS. 13 to 16 are enlarged, fragmentary sectional views taken on line A—A, line A–B, line C—C, line D—D, respectively, in FIG. 12 showing the lead frame 2 and the semiconductor chip 1 mounted on the lead frame 2 in a state after the completion of a die bonding process in an enlarged plan view. In FIGS. 12 to 16, chain lines indicate the sealing member 6 and it expresses the external shape or the sealing body 6 after the mold-ng as a virtual line.

As shown in FIG. 10(b), end portions of the inner parts 2c of the first leads 2a are fastened to the main surface 1b of the semiconductor chip 1 with an insulating tape 7, such as a polyimide tape to support the semiconductor chip on the first leads 2a. The outer part 2d of each lead 2e projects laterally outside from the side surface 6a of the sealing member 6, and bent so as to extend downward. A lower end portion of the outer part 2d is bent laterally so as to extend away from the sealing member 6. The outer parts 2d of the leads 2e are shaped to form gull-wing leads. The outer parts 2d of the first leads 2a and the second leads 2b protect outside from the side surfaces 6a of the sealing member 6 at positions above the level of the main surface 1b of the semiconductor chip 1.

As shown in FIG. 1(b), the sealing member 6 has the upper surface 6b on the side of the main surface 1b of the semiconductor chip 1, a lower surface 6c on the side of the back surface 1c of the semiconductor chip 1, and the four side surfaces 6a. Therefore, the distance H between the upper surface of a portion of the lead 2e projecting from the side surface 6a of the sealing member 6 and the upper surface 6b of the sealing member 6 is far shorter than the distance I between the lower surface of the same portion of the lead 2e projecting from the side surface 6a of the sealing member 6 and the lower surface 6c of the sealing member 6 (H<<I). Therefore, the outer part 2d of each lead 2e bent so as to extend downward can be formed in a very long length L. When the LOC 5 is mounted on a mounting board 11 (FIG. 20) by attaching the outer parts 2d of the leads 2e to a circuit formed on the mounting board 11 with solder for cycle tests, the outer parts 2d having the long length X reduces stress that is induced in the solder. Consequently, in the LOC 5 which achieved by chip shrinking the life of the solder bonding the outer parts 2c to the mounting board can be extended.

As shown in FIG. 10(a), the semiconductor chip 1 of the LOC 5 has a rectangular shape. As shown in FIG. 17, the plurality of bonding pads 1a are arranged in a middle region of the main surface 1b of the semiconductor chip 1 in a line substantially in parallel to the long sides of the main surface 1b of the semiconductor chip 1.

Functions of the pins (leads 2e) of the semiconductor chip 1 of the LOC 5 will be described with reference to FIG. 12. Indicated at Vcc are power supply pins, at Vss are grounding pins, $A_1$ to $A_{13}$ are address input pins, at RAS is a row address strobe pin, at CAS is a column address strobe pin, at $DQ_0$ to $DQ_{15}$ are data I/O pins, at CLK is a clock input pin, at CKE is a clock enable input pin, at WE is a write enable pin, at CS is a chip select pin, and a NC is a nonconnected pin.

As shown in FIG. 10(a), the sealing member 6 has a rectangular shape corresponding to the rectangular semiconductor chip 1. When the semiconductor chip is formed in a small size achieved by chip shrinking, a surrounding region of a relatively large area is formed around the semiconductor chip in the sealing member 6. The surrounding region will be divided into longitudinal end sections 6d contiguous with the opposite (outside) longitudinal ends of the semiconductor chip 1, and side sections (wide direction) 6e contiguous with the long sides of the semiconductor chip 1. The longitudinal end sections 6d and the side sections 6e will individually be described with reference to FIG. 10(a). The longitudinal end sections 6d extend contiguously with the opposite longitudinal ends of the semiconductor chip 1, respectively. The side sections 6e extends contiguously with the long sides of the semiconductor chip 1. At least the leads 2e arranged in the longitudinal end sections 6d have inner parts 2c provided with the bending portions 2k. In the second embodiment, both the leads 2e arranged in the longitudinal end sections 6d and those arranged in the long side sections 6e have the inner parts 2c provided wish the bending portions 2k, respectively.

In the LOC 5, the second leads 2b longer than the first leads 2a are arranged in the longitudinal end sections 6d of the sealing member 6, i.e., sections between the short sides of the semiconductor chip 1 and the short sides of the sealing member 6. The arrangement of the second leads 2b longer than the first leads 2a in the longitudinal end sections 6d contributes to enhancing rigidity of the longitudinal end sections 6d having a relatively large area, which is effective in preventing the transformation of the sealing member 6 of the LOC 5.

As shown in FIG. 17, the first leads 2a are arranged along and extended perpendicularly to the long sides of the semiconductor chip 1. Bus bar leads 2h respectively for cower supply and grounding branched from the second lead 2b are extended on the main surface 1b of the semiconductor chip 1. The bus bar leads 2h are extended across the opposite short sides of the semiconductor chip 1.

At least the second leads 2b among the leads 2e disposed in the longitudinal end sections 6d of the sealing member 6 are provided with a through hole 2i or a narrow slot 2j. The through hole 2i or the narrow slot 2j may be formed in the first leads 2a disposed in the longitudinal end sections 6d. The first leads 2a may be provided with both a through hole 2i and a narrow slot 2j, or either the through hole 2i or the narrow slot 2j. The leads 2e disposed in the side sections 6e may be provided with a through hole 2i or a narrow slot 2j.

When the resin 8 for sealing (FIG. 18) is injected in a cavity formed in a mold to form the sealing member 6, the resin 8 fills up the through holes 2i or the narrow slots 2j to enhance the adhesion of the sealing member 6 to the leads 2e, which suppresses the transformation of the sealing member 6 of the LOC 5. When the sealing resin 8 is injected into the cavity, the resin 8 is able to flow through the through hole 2i or he narrow slot 2j. Consequently, the resin 8 can be distributed properly to a space corresponding to a portion of the sealing member 6 overlying the inner parts 2c of the leads 2e and a space corresponding to a portion of the sealing member 6 underlying the inner parts 2c of the leads 2e in satisfactory resin balance, which suppresses the transformation of the sealing member 6.

Two kinds of level difference at the bending portion of the inner part 2c of the lead 2e, the level differences will be explained with reference to FIGS. 13 to 16. For example, a level difference P is 0.27 mm and a level difference Q (level difference Q in FIG. 16) is 0.10 mm. Therefore, P−Q=0.27−0.10=0.17 mm.

The LOC 5 has the leads 2e including the first leads 2a each having a first bending portion 2k falling in a direction from the main surface 1b toward the back surface 1c of the semiconductor chip 1 and a second bending portion 2i rising in a direction from the back surface 1c toward the main surface 1b of the semiconductor chip 1 as shown in FIGS. 14 and 15, the second leads 2b each having only a first bending portion 2k falling in a direction from the main surface 1b toward the back surface 1c of the semiconductor chip 1 as shown in FIG. 13, and third leads 2m each having only a first bending portion 2k falling in a direction from the main surface 1b toward the back surface 1c of the semiconductor chip 1 as shown in FIG. 16.

The first lead 2a shown in FIGS. 14 and 15 is disposed in the longitudinal end section 6d and has the inner part 2c having the two bending portions. An end portion of the inner part 2c of the first lead 2a is placed on the main surface of the semiconductor chip 1. The second lead 2b shown in FIG. 13 is disposed in the longitudinal end section 6d and has the inner part 2c having the one bending portion and terminating near the semiconductor chip 1. The third lead 2m shown In FIG. 16 is disposed in the side section 6e and has the inner part 2c having the one bending portion. An end portion of the inner part 2c of the third lead 2m is placed on the main surface of the semiconductor chic 1.

The first bending portions 2k and the second bending portions 2l are formed in the regions surrounding the semiconductor chip 1. In the LOC 5, the first bending portions 2k and the second bending portions 2l of the first leads 2a are formed in the longitudinal end sections 6d. The level of a portion of the inner part 2c of the first lead 2a extending from the upper end of the first bending portion 2k is higher than that of a portion of the inner part 2c of the first lead 2a extending from the upper end of the second bending portion 2l. The level of a portion of the inner part 2c of the first lead 2a between the first bending portion 2k and the second bending portion 2l is lower than that of the end portion of the inner part 2c of the same placed on the main surface 1b of the semiconductor chip 1.

Since the first bending portion 2k is formed near the side surface 6a of the sealing member 6 in the longitudinal end section 6d, the portion of the inner part 2c between the first bending portion 2k and the second bending portion 2l can be relatively long. Therefore, resin balance between the portion of the sealing member 6 overlying the leads 2e and the portion of the same underlying the leads 2e in the longitudinal end sections 6d is satisfactory, which suppresses the transformation of the sealing member 6 of the LOC 5.

As shown in FIGS. 14 to 16, the semiconductor chip 1 is sealed in the sealing member 6 so that the distance M between the upper surface 6b of the sealing member 6 and the upper surface of the end portion of the inner part 2c of each of the first leads 2a and the third leads 2m placed on the main surface 1b of the semiconductor chip 1 is substantially equal to the distance N between the back surface 1c of the semiconductor chip 1 and the lower surface 6c of the sealing member 6. Accordingly, resin balance between a portion of the sealing member 6 overlying the semiconductor chip 1 and a portion of the same underlying the semiconductor chip 1 is satisfactory.

A structural feature of the LOC 5 will be described in terms of the Inner part 2c of the first lead 2a. The inner part 2c has the portion between the first bending portion 2k and the second bending section 2l formed in the region surrounding the semiconductor chip 1 and extending on a level lower than that of the end portion resting on the semiconductor chip 1. In the sealing member 6 and in the area that is further far from the semiconductor chip 1 than a second bending portion 2l of the inner part 2c has a position (a position that the inner part 2c is projecting outside from the sealing member 6) on a level higher than that of a position on a level lower (an area between the first bending portion 2k and the second bending portion 2l) of the inner part 2c, the position on a level lower of the inner part 2c is formed by bending in the direction from the back surface 1c toward the main surface 1b of the semiconductor chip 1. Thus, the inner part 2c projects outside from the sealing member 6 at a position on a level higher than that of the semiconductor chip 1 and becomes into the outer part 2d.

A structural feature of the LOC 5 will be described in terms of the volume of the sealing member 6. In the LOC 5, a volume determined by the one or two bending portions, and the areas of the upper surface 6b of the sealing member 6 and the inner parts 2c having the bending portions is substantially equal to a volume determined by the one or two bending portions, and the areas of the lower surface 6c of the sealing member 6 and the inner parts 2c having the bending portions. Therefore, resin balance between the portion of the sealing member 6 overlying the inner parts 2c and the portion of the same underlying the inner parts 2c is satisfactory.

A structural feature of the LOC 5 will be described in terms of the sections of the region in the sealing member 6 surrounding the semiconductor chip 1. The leads 2e have inner parts 2c formed in the bending portions 2k and 2l each of which is bent from the main surface 1b to the basic surface 1c of the semiconductor chip 1, they are formed in the region surrounding the semiconductor chip 1 and in the sealing member 6. On that occasion, the bending portions having a many kinds of level differences are formed in the outside area of the semiconductor chip 1.

As shown in. FIGS. 13 to 16, in the LOC 5 In the second embodiment, the leads 2e have two kinds of bending portion, one of the inner parts 2c having the first bending portion 2k or another of the inner part 2c having both the first bending portion 2k and the second bending portion 2l. The level difference P corresponding to the height of the first bending portion 2k of the lead 2e disposed in the longitudinal end sections 6d is 0.27 mm, and the level difference Q corresponding to the height of the second bending portion 2l of the same lead 2e is 0.17 mm. The level difference P corresponding to the height of the first bending portion 2k of the lead 2e disposed in the side sections 6e is 0.17 mm. The inner part 2c of each lead 2e may have any number of different bending portions.

As shown in FIG. 16, the leads 2e having the inner parts 2c having the first bending portion 2k are disposed in the side sections 6e of the outside region in the width direction of he chip, and surrounding the semiconductor chip 1. Therefore, the level difference corresponding to the height of the bending portion of the inner part 2c of each of the leads 2e disposed in the longitudinal end sections 6d is different from that determined by the bending portion of the inner part 2c of each of the leads 2e disposed in the side sections 6e. The level difference corresponding to the height of the bending portion of the inner part 2c of each of the leads 2e disposed in the longitudinal end sections 6d is greater than that corresponding to the height of the bending portion of the inner part 2c of each of the leads 2e disposed in the side sections 6e.

As shown in FIGS. 13 to 16, the level difference corresponding to the height of the first bending portion 2k formed in the inner part 2c of each of the leads 2e disposed in the longitudinal end sections 6d is 0.27 mm, and the level difference corresponding to the height of the first bending portion 2k formed in the inner part 2c of each of the leads 2e disposed in the side section 6e is 0.17 mm. The area of the longitudinal end sections 6d in the sealing member 6 is greater than that of the side sections in the sealing member 6 and hence the sealing member is liable to transform in longitudinally. Therefore, the inner part 2c of each of the leads 2e disposed in the longitudinal end sections 6d has the first bending portion 2k determining the large level difference to improve resin balance between the portion of the sealing member 6 overlying the inner parts 2c and the portion of the same underlying the inner parts 2c. Thus, the transformation in the longitudinal direction of the LOC 5 can be prevented.

The inner parts 2c of the plurality of leads 2e disposed in the longitudinal end sections 6d have substantially same width and are arranged at substantially equal intervals. As shown in FIG. 11, the second leads 2b disposed in the longitudinal end sections 6d (FIG. 10) are provided with the through holes 2i and the narrow slots 2j to form the first leads 2a and the second leads 2b disposed in the longitudinal end sections 6d in a uniform width. The first leads 2a and the second leads 2b are arranged at substantially equal intervals and the same width. When stress is applied to a part of the sealing member 6 corresponding to the longitudinal end section 6d having a large area, the stress can be distributed and local stress concentration in the part corresponding to the longitudinal end section 6d can be avoided and, consequently, the transformation in the longitudinal direction of the sealing member 6 can be avoided.

Materials forming the components of the LOC 5 in the second embodiment will be described. The lead frame 2 having the first leads 2a, the second leads 2b and the third leads 2m is made of iron, copper or an iron-nickel alloy. The bonding wires 3 are thin metal wires of, for example, cold. The resin 8 forming the sealing member 6 is a thermosetting epoxy resin or the like. The insulating tape 7 fastening the semiconductor chip 1 to the inner parts 2c of the first leads 2a is a heat-resistant tape, such as a polyimide tape.

A process for manufacturing the semiconductor device (LOC 5) in the second embodiment will be described with reference to FIG. 19. The lead frame 2 shown in FIG. 11 is preparer in step S1 as shown in FIG. 19. The lead frame 2 has the plurality of leads 2e including the plurality of first leads 2a having the end portions placed on the main surface 1b of the semiconductor chip 1, the plurality of third leads 2m having end portions placed on the main surface 1b, and the plurality of second leads 2b having end portions terminating near the semiconductor chip 1. The inner carts 2c of the leads 2e to be sealed in the sealing member 6 has the first bending portions 2k and the second sloping sections 2l. The insulating tapes 7 are attached to the end portions of the inner parts 2c of the first leads 2a and the third leads 2m, and the bus bar leads 2h to hold the semiconductor chip 1 fixedly on the lead frame 2. Crosses (x) marked on the first Leads 2a, the second leads 2b and the bus bar leads 2h indicate the bonding portions 2f to be connected to the bonding wires 3 by a wire bonding process.

In step S2, the inner parts 2c of the leads 2e are bonded to the main surface 1b of the semiconductor chip 1 by a die bonding process. As shown in FIG. 12, the end portions of the inner parts 2c of the first leads 2a and the third leads 2m, and the bus bar leads 2h are bonded through the insulating tapes 7 to the main surface 1b of the semiconductor chip 1 by a thermal compression bonding process. Consequently, the semiconductor chip 1 is supported through the insulating tapes 7 on the end portions of the inner parts 2c of the first leads 2a and the third leads 2m, and the bus bar leads 2h.

In step S3, the end portions of the inner parts 2c are connected electrically to the corresponding bonding pads 1a of the semiconductor chip 1 by the bonding wires 3, respectively, as shown in FIG. 17.

In step S4, the semiconductor chip 1, the inner parts 2c of the leads 2e and the bonding wires 3 are sealed in the sealing member 6 by a transfer molding process using a mold 9 shown in FIG. 18. On that occasion, in the LOC 5, a part of the second lead 2b, i.e. the bus bar lead 2h serving as a power supply lead or a grounding lead is a branch lead branched from the second lead 2b. As shown in FIG. 18, the mold 9 is provided with a gate 9a (opening through which the molten resin 8 enters the cavity 9b) at a position corresponding to a suspension lead 2t for the bus bar lead 2h (FIG. 11). The resin 8 is injected through the gate 9a into the cavity 9b.

Since the inner part 2c of each second lead 2b has the first bending portion 2k at a position near the side surface of the cavity 9b as shown in FIG. 18, the flow of the molten resin 8 fed through the gate 9a extending along the suspension lead 2t into the cavity 9b is disturbed by the first bending portion 2k and a turbulent flow of the resin 8 is generated. Consequently, the molten resin 8 is distributed into a space in the cavity 9b corresponding to a portion of the sealing member 6 overlying the portion of the inner part 2c extending from the lower end of the first bending portion 2k and a space in the cavity 9b corresponding to a portion of the sealing member 6 underlying the same. Since the second lead 2b is provided with the through hole 2i and the narrow slot 2j as shown in FIG. 11, the cavity 9b can be charged up with the molten resin 8 that flows through hole 2l and the narrow slot 2j. Consequently, the sealing member 6 has satisfactory resin balance between an upper part 6f and a lower part 6g (FIGS. 13 and 14) hereof. Since the second leads 2b disposed in the longitudinal end sections 6d are provided with the through holes 2i and the narrow slots 2j, respectively, the upper part 6f and the lower part 6g of the sealing member 6 can be contacted by the resin 8 filling up the through holes 2i and the narrow slots 2j. Thus the sealing member 6 and the inner parts 2c of the leads 2e can firmly be joined together, which prevents the longitudinal transformation of the sealing member 6. When, injecting the molten resin 8 into the cavity 9b, the molten resin 8 is stored temporarily in a gate resin potted unit 9c.

In step S5, the lead frame 2 is cut and the outer parts 2d of the leads 2e are shaped. The outer parts 2d of the leads 2e are cut off a frame 2u of the lead frame 2. The outer parts 2d are separated from each other, and the outer parts 2d of the leads 2e are shaped to form gull-wing leads to complete the LOC 5.

The LOC 5 is subjected to various tests. The LOC 5 complete and passed the tests is incorporated into a module 10 as shown in FIG. 20. The module 10 is, for example, a memory module constructed by mounting a plurality of semiconductor devices (LOC 5) on the opposite surfaces of a mounting board 11 by reflow soldering or the like. When the LOC 5 is intended for such a memory module, the semiconductor chip 1 is a memory chip. The module 10 is not limited to the memory module and maybe a module having functions other than a storage function. The LOC 5 may be mounted on a mounting board or the like for independent use.

The LOC 5 in the second embodiment and the process or manufacturing the same have the following effects.

The LOC 5 provided with the semiconductor chip 1 formed in a small size achieved by chip shrinking has the second leads 2b having inner parts 2c not extended over the main surface 1b of the semiconductor chip 1, and the inner part 2c or each second lead 2b has at least either the first bending portion 2k or the second sloping section 2l. Therefore, the portion of the sealing member 6 overlying the first leads 2a and the second leads 2b and corresponding to the longitudinal end section 6d and the portion of the same underlying the first leads 2a and the second leads 2b and corresponding to the longitudinal end section 6d can be formed in satisfactory resin balance. Consequently, the transformation of the sealing member 6 of the LOC 5 can be prevented.

Since the inner parts of the second leads 2b and the third leads 2m have the bending portions, respectively, the bonding portions 2f of the second leads 2b and the third leads 2m connected to the bonding wires 3 are at low positions relative to the bonding pads 1a. Consequently, the wire 3 will not extend outside the sealing member 6 and the wire 3 cannot be seen through the sealing member 6.

Further, since the inner parts of the second leads 2b and the third leads 2m have the bending portions, respectively, the bonding portions 2f of the second leads 2b and the third leads 2m connected to the bonding wires 3 are at low positions relative to the bonding pads 1a. Consequently, the deformation of the bonding wires 3 due to wire flow during molding can be suppressed, which enhances the performance and reliability of the LOC 5.

Some of the first leads 2a having end portions placed on the semiconductor chip has the first bending portion 2k falling in a direction from the main surface 1b toward the back surface 1c of the semiconductor chip 1 and the second bending portion 2l nearer to the semiconductor chip 1 than the first bending portion 2k and rising in a direction from the back surface 1c toward the main surface 1b of the semiconductor chip 1. Therefore, resin balance of portions of the sealing member 6 corresponding to the longitudinal end sections 6d and the side sections 6e in the sealing member 6 is satisfactory and hence transformation of the LOC 5 provided with the semiconductor chin 1 of a small size achieved by chip shrinking can be prevented.

Although the invent on has been described in its preferred embodiments, the present invention is not limited thereto in its practical application and many changes and variations may be made without departing from the scope thereof. For example, the inner part 2c of each of the leads 2e of the LOC 5 may be formed in any suitable one of various shapes differing from each other in the number and posit on of bending portions.

Figure 21A:
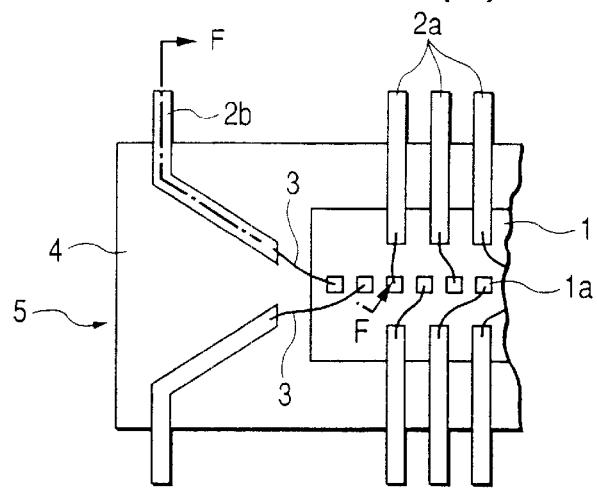
FIG. 21(a) is an enlarged, fragmentary plan view of a semiconductor device in a third embodiment according to the present invention, in which a sealing member is removed.
Figure 21B:
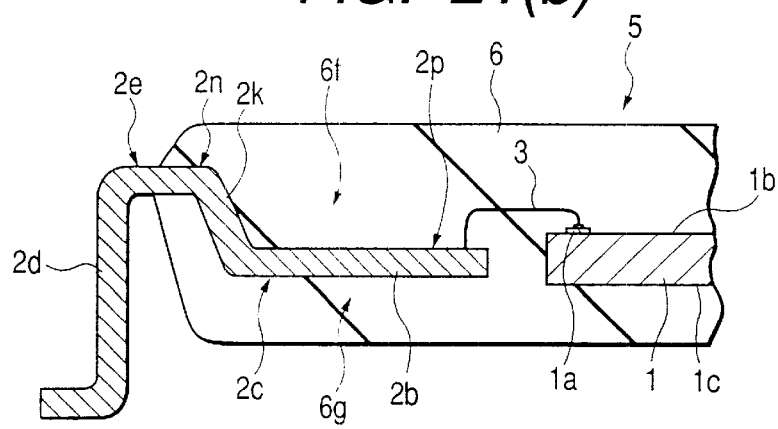
FIG. 21(b) is an enlarged, fragmentary sectional view taken on line F—F in FIG. 21(b)

A LOC 5 in an embodiment shown in FIG. 21(a) has a semiconductor chip 1, and second leads 2b each having an inner part 2c having a high portion 2n on a level above a main surface 1b of the semiconductor chip 1 and a low portion 2p on a level below the main surface 1b of the semiconductor chip 1 as shown in FIG. 21(b), and the total area of the low portions 2p of the inner parts 2c is grease than that of the high portions 2n of the inner parts 2c. Since the low portions 2p, the total area of which is greater than hat of the high portions 2n, are disposed in a middle region of a sealing member 6 with respect to height, resin balance is satisfactory in portions of the sealing member 6 corresponding to longitudinal end sections 6d contiguous with the opposite longitudinal ends of the semiconductor chip 1. Thus, transformation of the sealing member 6 can be prevented.

Figure 21C:
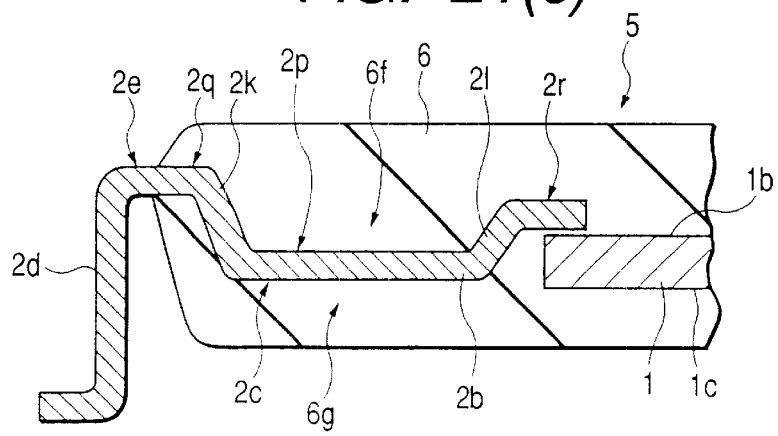
FIG. 21(c) is an enlarged, fragmentary sectional view of a modification of the semiconductor device shown in FIG. 21(b)

Each second lead 2b may have an inner part 2c having a first high portion 2q extending in the sealing member 6 near the side surface of the sealing member 6 on a level above the main surface 1b of the semiconductor chip 1, a second high portion 2r resting on the main surface 1b of the semiconductor chip 1 and a low portion 2p extending on a level below the main surface 1b of the semiconductor chip 1 between the first high portion 2q and the second high portion 2r as shown in FIG. 21(c) Since the first high portions 2q of the inner parts 2c of the second leads 2b are disposed in the sealing member 6 near the side surfaces of the sealing member 6, the first high portions 2q do not affect adversely to resin balance in portions of the sealing member 6 corresponding to the longitudinal end sections 6d. The second high portion 2r of the second lead 2b is on a level above that of the low portion 2p of the same, and the first high portion 2q of the second lead 2b is on a level above that of the second high portion 2r so the same.

Figure 22A:
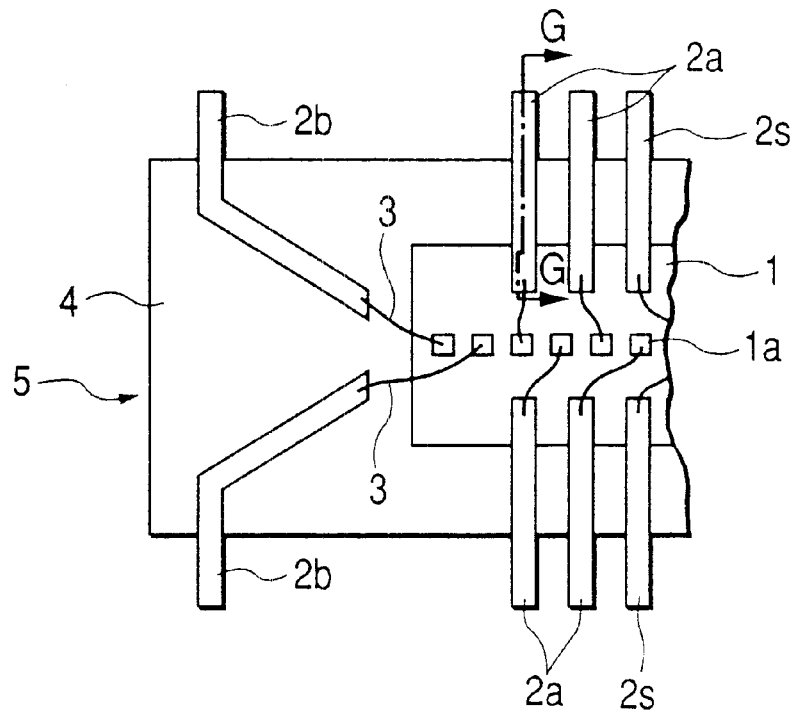
FIG. 22(a) is an enlarged, fragmentary plan view of a semiconductor device in a fourth embodiment according to the present invention, in which a sealing member is removed.
Figure 22B:
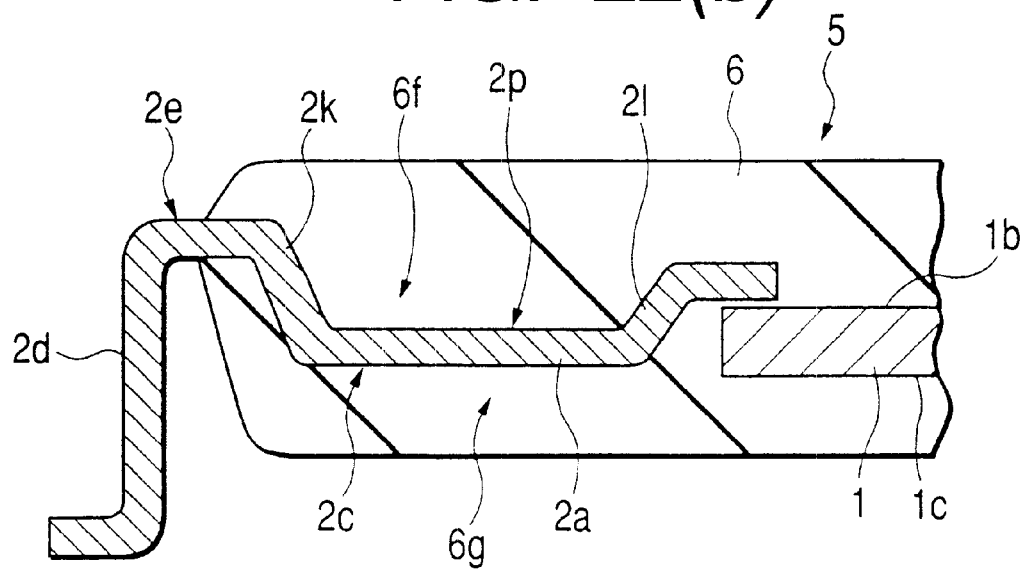
FIG. 22(b) is an enlarged, fragmentary sectional view taken on line G—G in FIG. 22(a).

FIGS. 22(a) and 22(b) show a LOC 5 in a further embodiment according to the present invention. Each of first leads 2a may be provided with zero to three bending portions. As shown in FIG. 22(b), each of some of first leads 2a and second leads 2b has a first bending port on 2k falling in a direction from the main surface 1b toward the back surface 1c of the semiconductor chip 1, and each of the same first leads 2a has a second bending portion 2l rising in a direction from the back surface 1c toward the main surface 1b of the semiconductor chip 1 and formed at a position nearer to the semiconductor chip 1 than the first bending portion 2k. Preferably, the first bending portion 2k is formed near a position where the lead 2e intersects the side surface 6a of a sealing member 6 perpendicularly. The first leads 2a may include leads 2s (FIG. 22(a)) each having only a bending portion falling in a direction from the main surface 1$b$ toward the back surface 1$c$ of the semiconductor chip 1. When each second lead 2$b$ has a branch lead, the branch lead of the second lead 2$b$ may be fastened to the main surface 1$b$ of the semiconductor chip 1. Preferably, the first bending portions 2$k$ and the second bending portions 2$l$ are disposed at least in longitudinal end sections 6$d$, i.e., sections between the opposite longitudinal ends of the semiconductor chip 1 and the corresponding opposite longitudinal ends of the sealing member 6. Both the first leads 2$a$ and the second leads 2$b$ or at least either the first leads 2$a$ or the second leads 2$b$ may be provided with the bending portion in the region surrounding the semiconductor chip 1.

Although the outer parts 2$d$ of the leads 2$e$ of the LOCs 5 in the first and the second embodiment are shaped to form the gull-wing leads, the outer parts 2$d$ of the leads 2$e$ may be shaped in leads of any suitable shape other than the gull-wing leads, such as J-shaped leads.

As is apparent from the foregoing description, the representative embodiments of the present invention have the following effects.

(1) Since the inner part of each of the second leads not disposed on the main surface or the semiconductor chip has the bending portion falling in a direction from the main surface toward the back surface or the semiconductor chip, the molten resin can be distributed in the cavity in satisfactory resin balance between a portion of the sealing member overlying the second leads and a portion of the same underlying the second leads corresponding to the longitudinal end section when molding. Consequently, transformation of the LOC provided with the semiconductor chip 1 of a small size achieved by chip shrinking can be prevented.

(2) Since the inner parts of the second leads have the bending portions, respectively, the bonding portions of the second leads connected to the bonding wires are at relatively low positions. Consequently, the bonding wires will not extend outside the seal ng member and cannot be seen through the sealing member. The deformation of the bonding wires connected to the second leads due to wire flow during molding can be suppressed, which enhances the performance and reliability of the LOC.

(3) Each of some of the first leads and the second leads has the first bending portion falling in a direction from the main surface toward the back surface of the semiconductor chip, and each of the same first leads has the second bending portion rising in a direction from the back surface toward the main surface of the semiconductor chip and formed at a position nearer to the semiconductor chip than the first bending portion. Therefore, resin balance of portions of the sealing member corresponding to the longitudinal end sections and the side sections in the sealing member is satisfactory and hence transformation of the LOC provided with the semiconductor chip of a small size achieved by chip shrinking can be prevented.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

The present invention includes further following invention:

1. A process for manufacturing a resin-molded semiconductor device comprising the steps of:
    preparing a lead frame having a frame member, and a plurality of leads including a plurality of first leads respectively having inner arts arranged so as to overlie a main surface of a semiconductor chip, and a plurality of second leads respectively having inner parts terminating near the semiconductor chip and having bending portions failing substantially in a direction from the main surface toward a back surface of the semiconductor chip;
    bonding the inner parts of the first leads to the main surface of the semiconductor chip;
    electrically connecting bonding pads of the semiconductor chip to the corresponding inner parts of the leads by bonding wires;
    forming a sealing member to seal the semiconductor chip, the inner parts of the leads and the bonding wires therein by substantially evenly distributing a resin in regions of a cavity of a mold on the upper and the lower side of the bending portions of the leads; and
    cutting off outer parts of the leads projecting from the sealing member from the framing member of the lead frame.

2. A process for manufacturing a resin-molded semiconductor device according to claim 1, wherein the second leads are bus bar leads respectively for power supply and grounding, and a molten resin is injected into the cavity of the mold provided with a gate formed at a position corresponding to a hanger lead for the bus bar lead.

3. A process for manufacturing a resin-molded semiconductor device according to claim 2, wherein each of the second leads is provided with at least either a through hole or a narrow slot, and the molten resin injected through the gate into the cavity flows through either the through hole or the narrow slot of each second lead so that the molten resin flows evenly into the regions of the cavity of the mold on the upper and the lower side of the bending portions of the leads.

4. A process for manufacturing a resin-molded semiconductor device according to claim 1, wherein insulating tapes are attached at least to inner end portions of the inner parts of the first leads, and the inner end portions of the inner parts of the first leads are bonded through the insulating tapes to the main surface of the semiconductor chip.

What is claimed is:

1. A method for manufacturing a resin-molded semiconductor device comprising the steps of:
    preparing a lead frame having a frame member, and a plurality of leads including a plurality of first leads respectively having inner parts arranged so as to overlie a main surface of a semiconductor chip, and a plurality of second leads respectively having inner parts terminating at a vicinity of the short sides of the semiconductor chip and having bending portions falling substantially in a direction from the main surface toward a back surface of the semiconductor chip;
    bonding the inner parts of the first leads to the main surface of the semiconductor chip;
    electrically connecting bonding pads of the semiconductor chip to the corresponding inner parts of the leads by bonding wires;
    forming a sealing member to seal the semiconductor chip, the inner parts of the leads and the bonding wires therein by substantially evenly distributing a resin in regions of a cavity of a mold on the upper and the lower side of the bending portions of the leads; and
    cutting off outer parts of the leads projecting from the sealing member from the framing member of the lead frame.

2. A method for manufacturing a resin-molded semiconductor device according to claim 1, wherein the second leads are bus bar leads respectively for power supply and grounding, and a molten resin is injected into the cavity of the mold provided with a gate formed at a position corresponding to a hanger lead for the bus bar lead.

3. A method for manufacturing a resin-molded semiconductor device according to claim 2, wherein each of the second leads is provided with at least either a through hole or a narrow slot, and the molten resin injected through the gate into the cavity flows through either the through hole or the narrow slot of each second lead so that the molten resin flows evenly into the regions of the cavity of the mold on the upper and the lower side of the bending portions of the leads.

4. A method for manufacturing a resin-molded semiconductor device according to claim 1, wherein insulating tapes are attached at least to inner end portions of the inner parts of the first leads, and the inner end portions of the inner parts of the first leads are bonded through the insulating tapes to the main surface of the semiconductor chip.

\* \* \* \* \*